(12) United States Patent
Fujisawa

(10) Patent No.: US 9,978,438 B2
(45) Date of Patent: *May 22, 2018

(54) DEVICE HAVING MULTIPLE SWITCHING BUFFERS FOR DATA PATHS CONTROLLED BASED ON IO CONFIGURATION MODES

(71) Applicant: Micron Technology, Inc., Boise, ID (US)

(72) Inventor: Hiroki Fujisawa, Tokyo (JP)

(73) Assignee: Micron Technology, Inc., Boise, ID (US)

( * ) Notice: Subject to any disclaimer, the term of this patent is extended or adjusted under 35 U.S.C. 154(b) by 0 days. days.

This patent is subject to a terminal disclaimer.

(21) Appl. No.: 15/614,037

(22) Filed: Jun. 5, 2017

(65) Prior Publication Data

US 2018/0061475 A1 Mar. 1, 2018

Related U.S. Application Data

(60) Continuation of application No. 15/393,149, filed on Dec. 28, 2016, now Pat. No. 9,704,561, which is a division of application No. 14/645,124, filed on Mar. 11, 2015, now Pat. No. 9,570,122.

(30) Foreign Application Priority Data

Mar. 18, 2014 (JP) .................................. 2014-054342

(51) Int. Cl.
| | | |
|---|---|---|
| G11C 11/4076 | (2006.01) | |
| G11C 11/408 | (2006.01) | |
| G11C 11/4096 | (2006.01) | |
| G11C 11/4093 | (2006.01) | |
| G11C 11/4091 | (2006.01) | |

(52) U.S. Cl.
CPC ...... *G11C 11/4076* (2013.01); *G11C 11/4087* (2013.01); *G11C 11/4091* (2013.01); *G11C 11/4093* (2013.01); *G11C 11/4096* (2013.01)

(58) Field of Classification Search
CPC ........................ G11C 11/4076; G11C 11/4087
USPC ........................................................ 365/63
See application file for complete search history.

(56) References Cited

U.S. PATENT DOCUMENTS 6,163,496 A * 12/2000 Sasaki .................. G11C 7/1006
365/230.03

FOREIGN PATENT DOCUMENTS

JP 08-139287 5/1996

* cited by examiner

*Primary Examiner* — Hoai V Ho
*Assistant Examiner* — Muna A Techane
(74) *Attorney, Agent, or Firm* — Dorsey & Whitney LLP

(57) ABSTRACT

A device includes a first data terminal, a second data terminal, a first switching buffer coupled between a data node and the first data terminal and a second switching buffer coupled between the data node and the second data terminal. The first switching buffer and the second switching buffer are arranged such that a distance between the first switching buffer and the second data terminal is shorter than a distance between the second switching buffer and the second data terminal and that a distance between the first switching buffer and the first data terminal is shorter than a distance between the second switching buffer and the first data terminal.

18 Claims, 18 Drawing Sheets

DEVICE HAVING MULTIPLE SWITCHING BUFFERS FOR DATA PATHS CONTROLLED BASED ON IO CONFIGURATION MODES

CROSS-REFERENCE TO RELATED APPLICATIONS

This application is a continuation of U.S. patent application Ser. No. 15/393,149, filed Dec. 28, 2016, U.S. Pat. No. 9,704,561 issued on Jul. 11, 2017, which is a divisional of U.S. patent application Ser. No. 14/645,124, filed Mar. 11, 2015, U.S. Pat. No. 9,570,122 issued on Feb. 14, 2017, which claims the filing benefit of Japanese patent application No. 2014-054342 filed on Mar. 18, 2014. These applications and patent are incorporated by reference herein in their entirety and for all purposes.

BACKGROUND

Field of the Invention

This invention relates to a semiconductor device, in particular, a semiconductor device that has a plurality of memory cell arrays.

Description of the Related Art

In a semiconductor device, such as DRAM (Dynamic Random Access Memory), a memory cell, array is divided into multiple regions and data input/output terminals, data buses, etc., are arranged between the divided memory cell array regions in many cases (see patent document 1).

[Patent document 1] Japanese Laid-Open Patent Publication No. 8-139287

However, some methods of assigning memory cell array regions and data buses and of laying out data buses pose various problems, such as a shift in data input/output timing between memory cell array regions, an increase in the number of necessary shield lines, and a change in data input/output timing depending on operation modes.

SUMMARY

In one embodiment, there is provided a device that includes a memory cell array including a plurality of memory cells, a data node coupled to transfer data from/to a selected one of the plurality of memory cells, a first data terminal, a second data terminal, a first switching buffer coupled between the data node and the first data terminal and a second switching buffer coupled between the data node and the second data terminal. The first switching buffer and the second switching buffer are arranged such that a distance between the first switching buffer and the second data terminal is shorter than a distance between the second switching buffer and the second data terminal and that a distance between the first switching buffer and the first data terminal is shorter than a distance between the second switching buffer and the first data terminal.

In another embodiment, there is provided a device that includes an active area having a square shape divided into first, second, third, fourth, fifth, sixth, seventh, eighth and ninth regions arranged in a matrix, a plurality of memory arrays each including a plurality of memory cells arranged in each of the first, second, third and fourth regions, a plurality of data terminals arranged in the eighth region, a first switching buffer coupled between a data node of one of the memory arrays and one of the data terminals, a second switching buffer coupled between the data node of the one of the memory cell arrays and a different one of the data terminals. The first, second, third and fourth regions are arranged at respective corners of the square. The fifth region is arranged at a center of the matrix. The sixth, seventh, eighth and ninth regions are arranged between the first and second regions, the second and third regions, the third and fourth regions and the fourth and first regions, respectively. The first switching buffer is arranged in the seventh region. The second switching buffer is arranged in the seventh region.

In still another embodiment, there is provided a device that includes, a first memory array, a second memory array, a plurality of first data terminals and second data terminals arranged in the first direction between the first memory array and the second memory array, a third memory array arranged such that the first memory array is arranged between the third memory array and the plurality of first data terminals and second data terminals, a fourth memory array arranged such that the second memory array is arranged between the fourth memory array and the plurality of first data terminals and second data terminals and a data bus. The data bus is configured to couple each of the first memory array and the second memory array to the first data terminals in a first operation mode, couple each of the first memory array and the second memory array to the second data terminals in a second operation mode, and couple to the third memory array and the fourth memory array to the second data terminals in each of the first operation mode and the second operation mode.

DETAILED DESCRIPTION OF THE EMBODIMENTS

Preferred embodiments of the present invention will now be described in detail with reference to the accompanying drawings.

Figure 1:
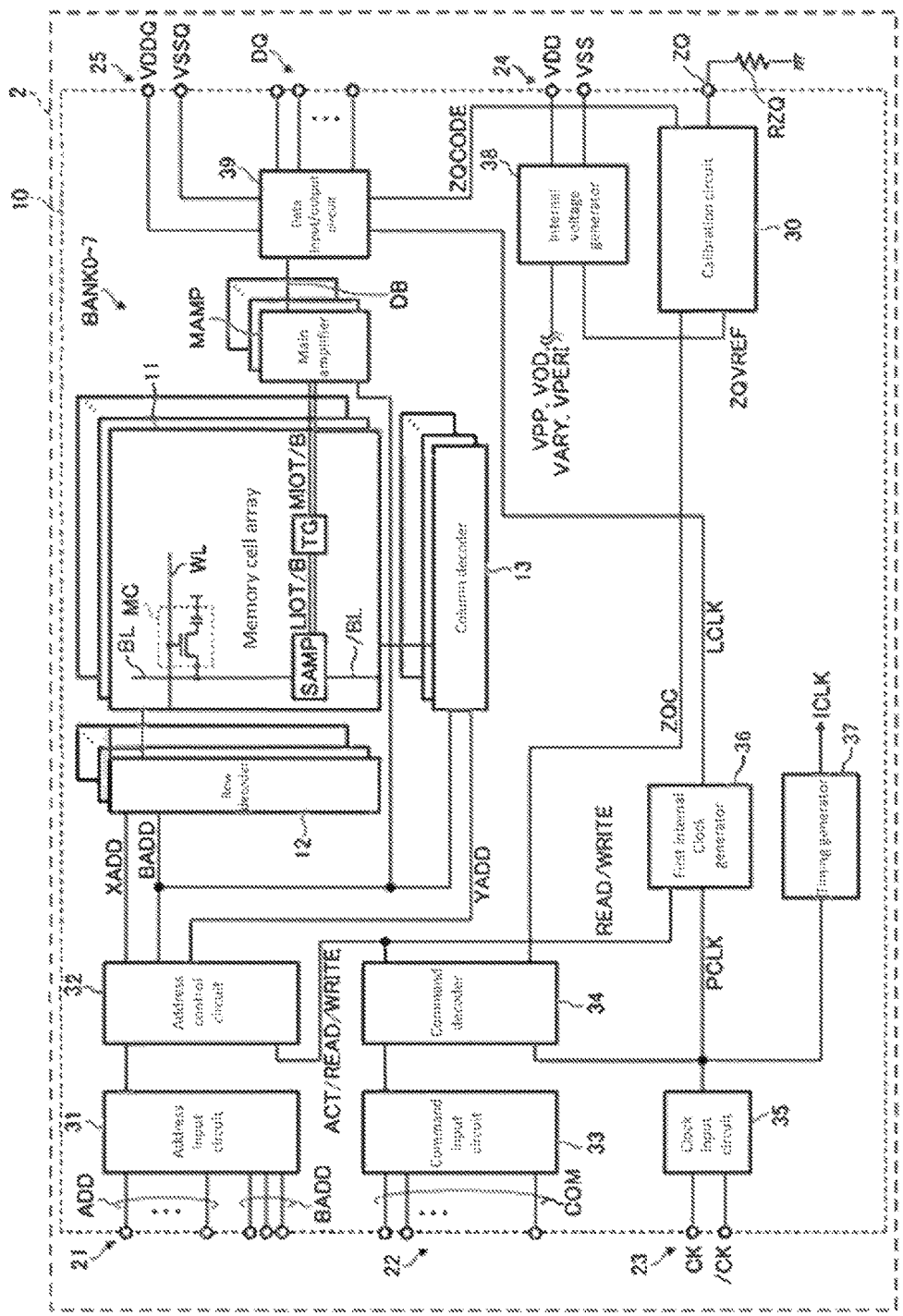
FIG. 1 is a block diagram of an overall configuration of a semiconductor device according to an embodiment of the present invention.

FIG. 1 is a block diagram of an overall configuration of a semiconductor device 10 according to an embodiment of the present invention.

The semiconductor device 10 of this embodiment is a DDR4 (Double Data Rate 4) DRAM packaged in a single semiconductor chip, and is mounted on an external substrate 2. The external substrate 2 is a memory module substrate or mother board, and includes a reference resistance RZQ. The reference resistance RZQ is coupled to a calibration terminal ZQ of the semiconductor device 10, and the impedance of the reference resistance RZQ is used as reference impedance to a calibration circuit 30. The reference resistance RZQ is supplied with a ground voltage VSS in this embodiment.

As shown in FIG. 1, the semiconductor device 10 includes eight memory banks BANK0 to BANK7. Each of the memory banks BANK0 to BANK7 is capable of operating exclusively, that is, capable of independently executing a command, and has a memory cell array 11, a row decoder 12, a column decoder 13, and a main amplifier MAMP. The memory cell array 11 has multiple word lines multiple bit lines BL and /BL, and memory cells MC arranged at the intersections of the word lines WL and the bit lines BL and /BL. A word line WL is selected by the row decoder 12, while a bit line BL is selected by the column decoder 13.

Paired bit lines BL and /BL are coupled to a sense amplifier SAMP disposed in the memory cell array 11. The sense amplifier SAMP amplifies a potential difference created between the bit BL and the bit line /BL and supplies read data obtained by amplifying the potential difference to a complementary local IO line LIOT/LIOB. The read data supplied to the local IO line LIOT/LIOB is transferred to a complementary main IO line MIOT/MIOB via a switch circuit TG. The read data on the main IO line MIOT/MIOB is then converted into a single-ended signal by the main amplifier MAMP, and is supplied to a data input/output circuit 39 via a data bus DB.

The semiconductor device 10 also includes an address terminal 21, a command terminal 22, a clock terminal 23, power terminals 24 and 25, a data input/output (IO) terminal DQ, and the calibration terminal ZQ, which serve as external terminals.

The address terminal 21 is a terminal that receives an address signal ADD and a bank address signal BADD that are incoming external signals. The address signal ADD and bank address signal BADD input to the address terminal 21 are supplied to an address control circuit 32 via an address input circuit 31. The bank address signal BADD supplied to the address control circuit 32 is used as a signal for selecting any one of the memory banks BANK0 to BANK7. An address signal ADD representing a row address XADD supplied to the row decoder 12 of a selected memory bank, and an address signal ADD representing a column address YADD is supplied to the column decoder 13 of a selected memory bank.

The command terminal 22 is a terminal that receives an incoming external command signal COM. The command signal COM input to the command terminal 22 is supplied to a command decoder 34 via a command input circuit 33. The command decoder 34 is as circuit that generates various internal commands by decoding the command signal COM. Internal commands include an active signal ACT, a read signal READ, a write signal WRITE, and a calibration signal ZQC.

The active signal ACT is a signal that is activated when the command signal COM indicates a row-accessing command (active command). When the active signal ACT is activated, the row address XADD supplied to the address control circuit 32 is supplied to the row decoder 12 of a selected memory bank. As a result, a word line included in the memory cell array 11 of the selected memory bank is selected based on the row address XADD.

The read signal READ and the write signal WRITE are activated when the command signals COM indicate a read command and a write command, respectively. When the read signal READ or write signal WRITE is activated, the column address YADD supplied to the address control circuit 32 is supplied to the column decoder 13 of a selected memory bank. As a result, a bit line BL or /BL included in the memory cell array 11 of the selected memory bank is selected based on the column address YADD.

When the active command and read command are input and the row address XADD and column address YADD are also input in synchronization with input of the active command and read command, therefore, read data is read from the memory cell MC specified by the row address XADD and column address YADD. The read data is transferred to the data input/output terminal DQ is the main amplifier MAMP and the data input/output circuit 39, and is output from the data input/output terminal DQ to an external element.

When the active command and write command are input, and the row address XADD and column address YADD are also input in synchronization with input of the active command and write command, and then write data is input to the data input/output terminal DQ, the write data is supplied to the memory cell array 11 via the data input/output circuit 39 and the main amplifier MAMP and is written to the memory cell MC specified by the row address XADD and column address YADD.

The calibration signal ZQC is a signal that is activated when the command signal COM indicates a calibration command. When the calibration signal ZQC is activated, the calibration circuit 30 executes a calibration operation, thereby generates an impedance code ZQCODE.

The external terminals included in the semiconductor device 10 will be described again. The clock terminal 23 receives incoming external clock signals CK and /CK. The external clock signal CK and the external clock signal /CK are complementary to each other, and are supplied to a clock input circuit 35. Receiving the incoming external clock signals CK and /CK, the clock input circuit 35 generates an internal clock signal PCLK, which is supplied to a first internal clock generator 36. The first internal clock generator 36 generates a phase-controlled internal clock signal LCLK based on the internal clock signal PCLK. The first internal clock generator 36 may be, for example, a DLL circuit. Circuits other than a DLL circuit may be used as the first internal clock generator 36. The internal clock signal LCLK is supplied to the data input/output circuit 39, which uses the internal clock signal LCLK as a timing signal for determining timing of outputting read data.

The internal clock signal PCLK is supplied also to a timing generator 37, which generates various internal clock signals ICLK based on the internal clock signal PCLK. The internal clock signals ICLK generated by the timing generator 37 are supplied to such circuit blocks as the row decoder 12 and column decoder 13, where the internal clock signals ICLK regulate the operation timing of the circuit blocks.

The power terminal 24 is a terminal supplied with the source voltages VDD and VSS. The source voltages VDD and VSS supplied to the power terminal 24 are supplied to art internal voltage generator 38, which generates various internal voltages VPP, VOD, VARY, and VPERI and a reference voltage ZQVREF, based on the source voltages VDD and VSS. The internal voltage VPP is a voltage used mainly by the row decoder 12, the internal voltages VOD and VARY are voltages used by the sense amplifier SAMP in the memory cell array 11, and the internal voltage VPERI is a voltage used by a number of other circuit blocks. The reference voltage ZQVRET is a reference voltage used by the calibration circuit 30.

The power terminal 25 is a terminal supplied with source voltages VDDQ and VSSQ. The source voltages VDDQ and VSSQ supplied to the power terminal 25 are supplied to the data input/output circuit 39. The source voltages VDDQ and VSSQ are identical in potential with the source voltages VDD and VSS supplied to the power terminal 24, respectively. To prevent power noise generated by the data input/output circuit 39 from propagating to other circuit blocks, the source voltages VDDQ and VSSQ are used exclusively as source voltages to the data input/output circuit 39.

The calibration terminal ZQ is coupled to the calibration circuit 30. When activated by the calibration signal ZQC, the calibration circuit 30 carries out the calibration operation, referring to the impedance of the reference resistance RZQ and to the reference voltage ZQVREF. The impedance code ZQCODE acquired by the calibration operation is supplied to the data input/output circuit 39, where the impedance of an output unit included in the data input/output circuit 39 is specified according to the impedance code ZQCODE.

A layout of the semiconductor device 10 will then be described.

Before description of layouts according to embodiments of the present invention, a prototype-based layout will first be described.

Figure 2:
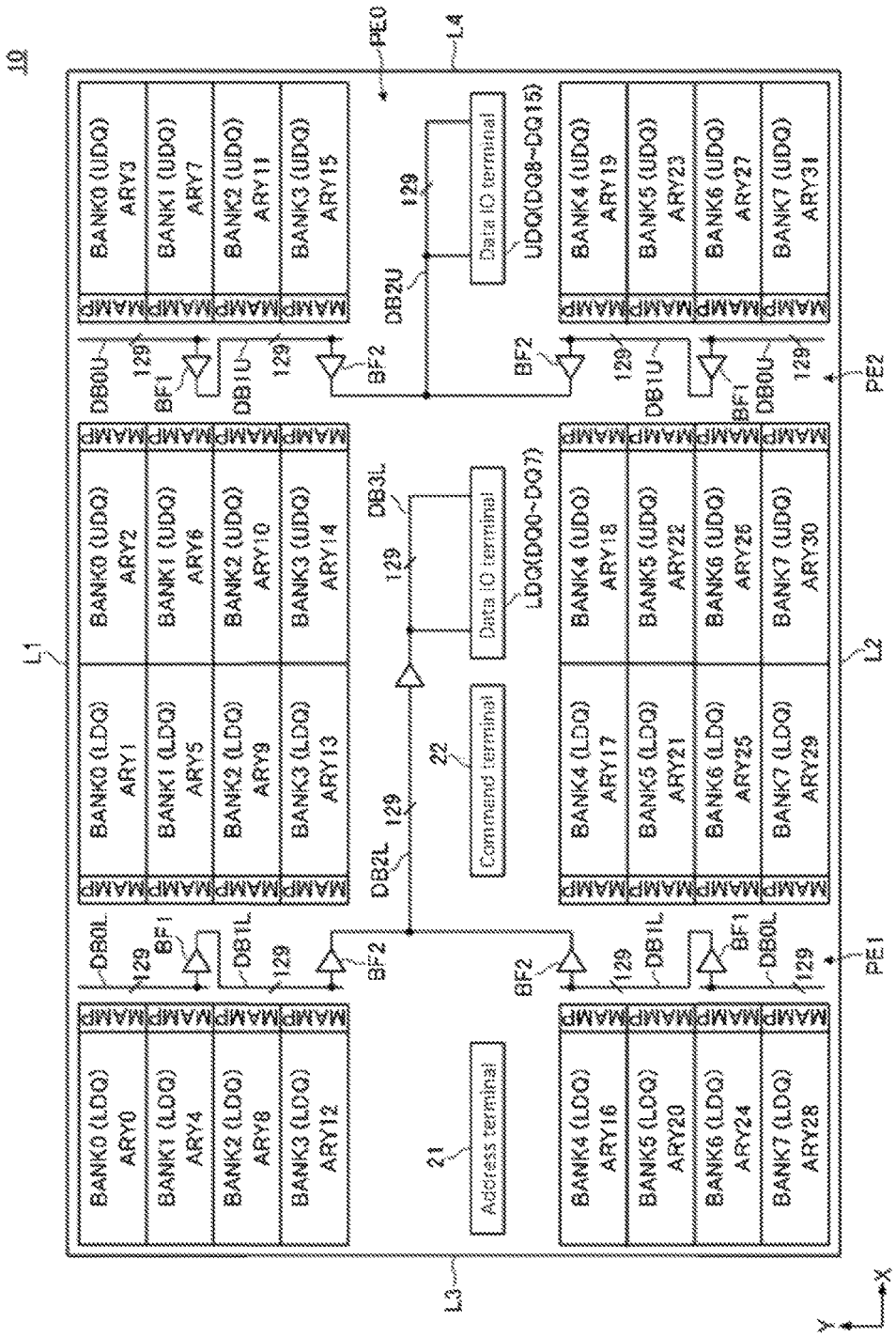
FIG. 2 is a plan view of a layout of a prototype of the semiconductor device.

FIG. 2 is a plan view of a layout of a prototype of the semiconductor device 10.

According to the layout of the prototype of FIG. 2, memory cell arrays 11 comprising 8 memory banks are divided into 32 memory cell array regions ARY0 to ARY31 arranged into 4 columns of memory cell array regions in the X direction and into 8 rows of memory cell array regions in the Y direction. Each row of 4 memory cell array regions comprises one memory bank. For example, 4 memory cell array regions ARY0 to ARY3 make up the memory bank BANK0.

Memory cell array regions ARY0 to ARY15 comprising memory banks BANK0 to BANK3 are arranged closer to one edge L1 (upper edge) of the chip in the Y direction, while memory cell array regions ARY16 to ARY31 making up memory banks BANK4 to BANK7 are arranged closer to the other edge L2 (lower edge) of the chip in the Y direction. A region formed between the memory cell array regions ARY0 to ARY15 and the memory cell array regions ARY16 to ARY31 is used as a peripheral circuit region PE0 extending through the central area of the chip in the X direction.

External terminals, such as the address terminal 21, command terminal 22, and data input/output terminal DQ, are placed in the peripheral circuit region PE0 such that the address terminal 21 and command terminal 22 are placed closer to one edge L3 (left edge) of the chip in the X direction while the data input/output (IO) terminal DQ is placed closer to the other edge L4 (right edge) of the chip in the X direction. In a region where the address terminal 21 and command terminal 22 are placed, which region is included in the peripheral circuit region PE0, circuit blocks related to the address signal ADD and command signal COM are also placed. For example, the address control circuit 32, command decoder 34, etc., are placed in that region.

The data input/output terminal DQ processes data of 16 bits. A data input/output terminal LDQ (=each of input/output terminals DQ0 to DQ7) that processes data of 8 bits comprising one half of the data of 16 bits is disposed on a part close to the central area of the chip, and a data input/output terminal UDQ (=each of input/output terminals DQ8 to DQ15) that processes data of 8 bits comprising the other half of the 16 bits of data is disposed on a part close to the edge L4 of the chip.

As shown in FIG. 2, out of four memory cell array regions making up each memory bank, two memory cell array regions are assigned to the input/output terminal LDQ and the other two memory cell array regions are assigned to the input/output terminal UDQ. The memory cell array regions assigned to the input/output terminal LDQ are disposed closer to the edge L3 (left edge) of the chip, while the memory cell array regions assigned to the input/output terminal UDQ are disposed closer to the edge L4 (right edge) of the chip.

A region formed between the two memory cell regions assigned to the input/output terminal LDQ is provided as a peripheral circuit region PE1, and a region formed between the two memory cell regions assigned to the input/output terminal UDQ is provided as a peripheral circuit region PE2. In the peripheral circuit regions PE1 and PE2, data buses DB0L and DB1L and DB0U and DB1U extending in the Y direction are placed, respectively.

The data buses DB0L and DB0U are assigned to the memory banks BANK0 and BANK1 near the edge L1 of the chip and to the memory banks BANK6 and BANK7 near the edge L2 of the chip, and are coupled respectively to the data buses DB1L and DB1U via buffers BF1. The data buses DB1L and DB1U are assigned to the memory banks BANK2 to BANK5 near the center of the chip, and are coupled respectively to data buses DB2L and DB2U placed in the peripheral circuit region PE0, via buffers BF2.

The peripheral circuit region PE0 is provided with the data buses DB2L, DB2U, and DB3L extending in the X direction. The data bus DB2L is coupled to the data bus DB3L via a buffer BF3. The data bus DB3L is coupled to the data input/output terminal LDQ. The data bus DB2U is coupled to the data input/output terminal UDQ.

In this configuration, one half of read data from the memory banks BANK0, BANK1, BANK6, and BANK7 is transferred to the data input/output terminal LDQ via the data buses DB0L, DB1L, DB2L, and DB3L, while the other half of the read data is transferred to the data input/output terminal UDQ, via the data buses DB0U, DB1U, and DB2U. In this case, one half of the read data is transferred to the data input/output terminal LDQ via three buffers BF1 to BF3, while the other half of the read data is transferred to the data input/output terminal UDQ via two buffers BF1 and BF2.

One half of read data from the memory banks BANK2 to BANK5 is transferred to the data input/output terminal LDQ via the data buses DB1L, DB2L, and DB3L, while the other half of the read data is transferred to the data input/output terminal UDQ via the data buses DB1U and DB2U. In this case, one half of the read data is transferred to the data input/output terminal LDQ via two buffers BF2 and BF3, while the other half of the read data is transferred to the data input/output terminal UDQ via one buffer BF2.

The semiconductor device 10 according to this embodiment is a DRAM that performs 8-bit pre-fetching, and is therefore capable of reading read data of up to 128 bits (=8 bits×16 input/output terminals DQ0 to DQ15) for one access. One half and the other half of the read data of 128 bits read, i.e., one block of data of 64 bits and the other block of data of 64 bits, are transferred to the data input/output terminals LDQ and UDQ, respectively. Each data bus DB, therefore, handles data of 64 bits.

Figure 3:
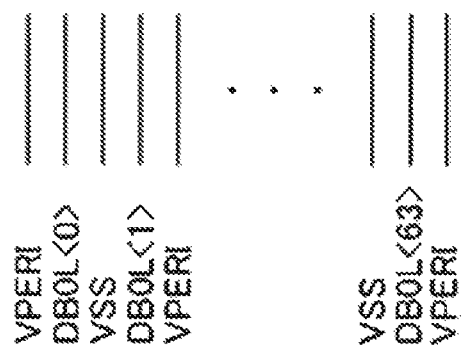
FIG. 3 is a diagrammatical view for explaining the structure of a data bus DB in the prototype.

In this configuration, however, crosstalk between different lines must be prevented. As shown in FIG. 3, therefore, a shielding power line is disposed on both sides of each of 64 data lines including each data bus DB. FIG. 3 depicts the case of the data bus DB0L, in which the data bus DB0L is composed of 64 data lines DB0L<0> to DB0L<63> and each of them is shielded on its both sides with a VSS line and a VPERI line. Each data bits DB having such a configuration thus needs 129 lines (data lines plus power lines) in total.

Figures 4A, 4B:
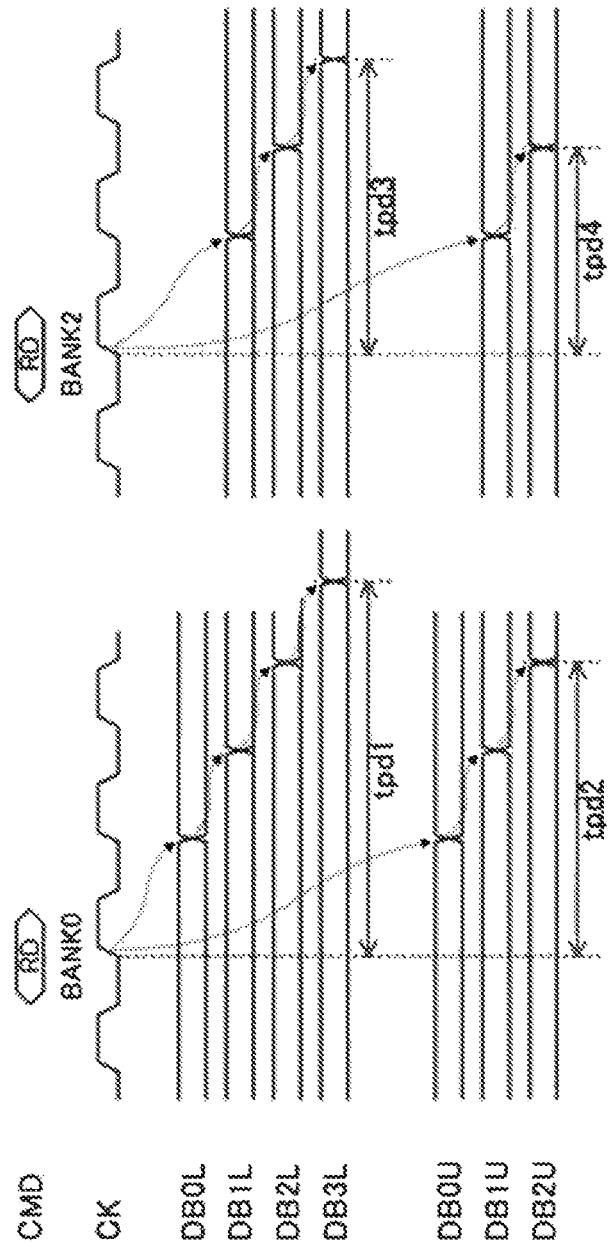
FIG. 4 is a timing chart for explaining the operation timing of the semiconductor device having a prototype-based layout, including FIG. 4(A) depicting transfer of read data read out of a memory bank BANK0 and FIG. 4(B) depicting transfer of read data read out of a memory bank BANK2.

FIG. 4 is a timing chart for explaining the operation timing of the semiconductor device 10 having a prototype based layout, including FIG. 4(A) depicting the transfer of read data from the memory bank BANK0 and FIG. 4(B) depicting the transfer of read data from the memory bank BANK2.

As shown in FIG. 4(A), out of read data from the memory bank BANK0, a block of read data assigned to the data input/output terminal LDQ is transferred through the data buses DB0L, DB1L, DB2L, and DB3L. In this case, a time that the read data takes from the issue of a read command RD to the read data's arrival at the data input/output terminal LDQ is tpd1. Out of the read data front the memory bank BANK0, a block of read data assigned to the data input/output terminal UDQ is transferred through the data buses DB0U, DB1U, and DB2U. In this case, a time that the read data takes from the issue of the read command RD to the read data's arrival at the data input/output terminal UDQ is tpd2 (<tpd1).

As shown in FIG. 4(B), out of read data from the memory bank BANK2, a block of read data assigned to the data input/output terminal LDQ is transferred through the data buses DB1L, DB2L, and DB3L. In this case, a time that the read data takes from the issue of the read command RD to the read data's arrival at the data input/output terminal LDQ is tpd3 (approximately equal to tpd2). Out of the read data from the memory bank BANK2, a block of read data assigned to the data input/output terminal UDQ is transferred through the data buses DB1U and DB2U. In this case, a time that the read data takes from the issue of the read command RD to the read data's arrival at the data input/output terminal UDQ is tpd4 (<tpd3).

In this manner, according to the prototype-based layout, a time at which read data from each memory bank arrives at the data input/output terminal LDQ does not match a time at which the read data arrives at the data input/output terminal UDQ. In addition, such timing of data arrival varies depending on the location of a memory bank to be accessed. These facts apply also to the case of a write operation.

The prototype-based layout, therefore, requires designing that matches timing of data arrival through other access paths to timing of data arrival through the access path with the maximum delay (e.g., the path leading from the memory bank BANK0 to the data input/output terminal LDQ). This puts a limit on access speed.

The prototype-based layout also requires that the data bus DB2L should pass through the region in which the address control circuit 32, the command decoder 34, etc., are placed. The data bus DB2L is a line having nothing to do with the operation of the address control circuit 32 and the command decoder 34 and yet must pass through the region including the address control circuit 32 and command decoder 34. This leads to a problem that a region for forming lines necessary for the operation of the address control circuit 32 and command decoder 34 is reduced and consequently a degree of freedom in line layout decreases.

Layouts of the semiconductor device 10 according to first and second embodiments will then be described.

Figure 5:
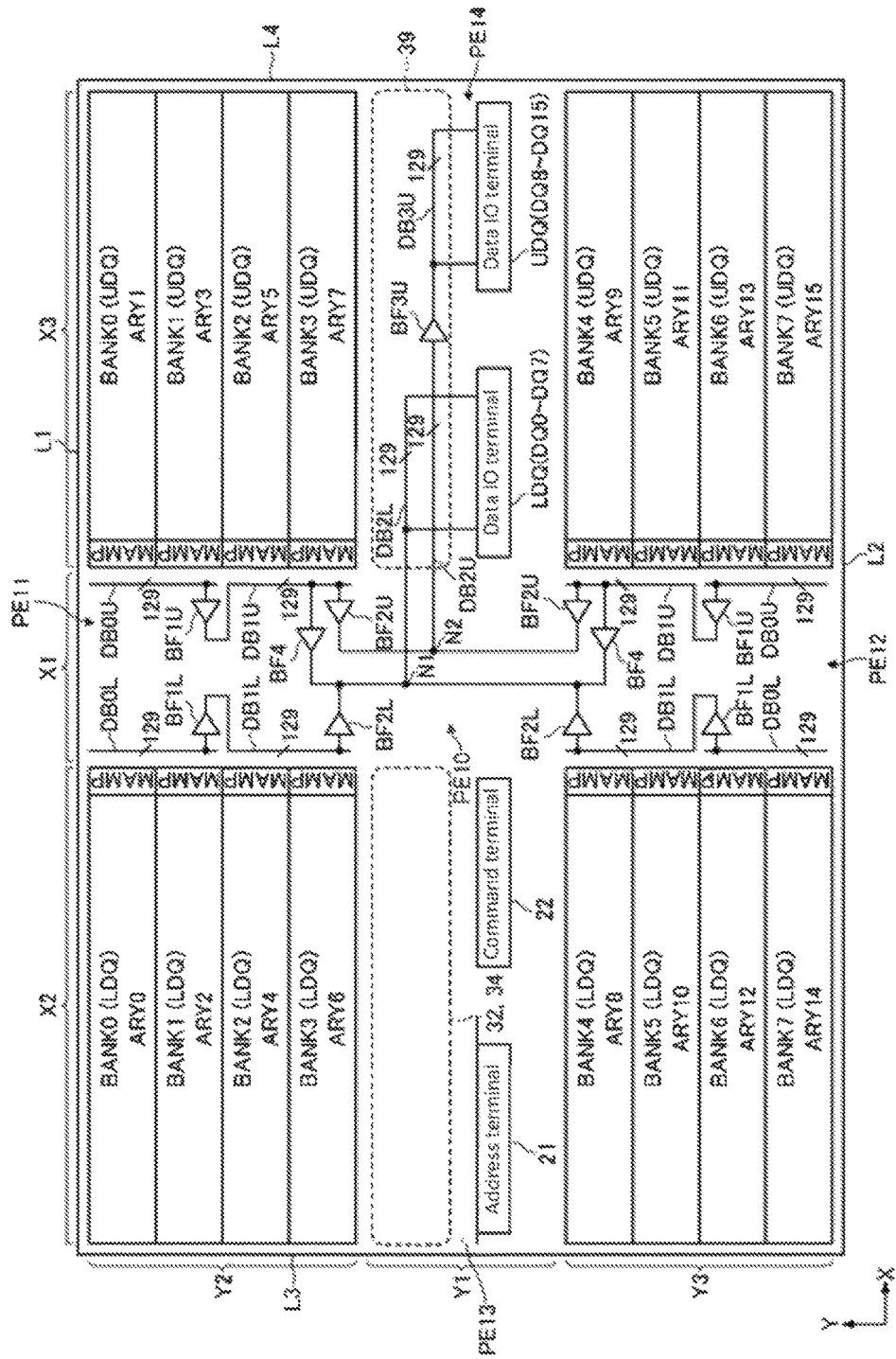
FIG. 5 is a plan view of a layout of the semiconductor device according to a first embodiment, showing a case where a first operation mode is selected.

FIG. 5 is a plan view of a layout of the semiconductor device 10 according to a first embodiment.

In the first embodiment, the same square semiconductor chip as the prototype of the semiconductor device 10 is used, which chip has the edges L1 and L2 extending in the X direction and the edges L3 and L4 extending in the Y direction. According to the first embodiment of the present invention, however, the memory cell arrays 11 comprise 8 memory banks divided into 16 memory cell array regions ARY0 to ARY15 arranged into 2 columns of memory cell array regions in the X direction and into 8 rows of memory cell array regions in the Y direction. Each row of 2 memory cell array regions comprises one memory bank. The memory cell array regions arranged closer to one edge L3 (left edge) of the chip in the X direction are assigned to the data input/output terminal LDQ, while the memory cell array regions arranged closer to the other edge L4 (right edge) of the chip in the X direction are assigned to the data input/output terminal UDQ.

The memory cell array regions ARY0 to ARY7 comprise the memory banks BANK0 to BANK3 are arranged closer to one edge L1 (upper edge) of the chip in the Y direction, while the memory cell array regions ARY8 to ARY15 making up the memory banks BANK4 to BANK7 are arranged closer to the other edge L2 (lower edge) of the chip in the Y direction.

More specifically, when the coordinates of the chip in the X direction and the Y direction are divided into coordinates X1 to X3 and coordinates Y1 to Y3, respectively, the memory cell array regions ARY0, ARY2, ARY4, and ARY6 are arranged in increasing order in the Y direction in a region where the coordinates X2 and Y2 intersect. In the same manner, the memory cell array regions ARY1, ARY3, ARY5, and ARY7 are arranged in increasing order in the Y direction in a region where the coordinates X3 and Y2 intersect, the memory cell array regions ARY8, ARY10, ARY12, and ARY14 are arranged in increasing order in the Y direction in a region where the coordinates X2 and Y3 intersect, and the memory cell array regions ARY9, ARY11, ARY13, and ARY15 are arranged in increasing order in the Y direction in a region where the coordinates X3 and Y3 intersect.

The region corresponding to the chip coordinates X1 and Y1 is a peripheral circuit region, which include a peripheral circuit region PE10 representing a region where the coordinates X1 and Y1 intersect, a peripheral circuit region PE11 representing a region where the coordinates X1 and Y2 intersect, a peripheral circuit region PE12 representing a region where the coordinates X1 and Y3 intersect, a peripheral circuit region PE13 representing a region where the coordinates X2 and Y1 intersect, and a peripheral circuit region PE14 representing a region where the coordinates X3 and Y1 intersect. The peripheral circuit region PE10 is the central region located at the center of the chip.

The address terminal 21, the command terminal 22, and circuit blocks related to those terminals, such as the address control circuit 32 and the command decoder 34, are placed in the peripheral circuit region PE13. The data input/output terminal DQ and circuit blocks related thereto, such as the data input/output circuit 39, are placed in the peripheral circuit region PE14. The data input/output terminal DQ processes data of 16 bits. The data input/output terminal LDQ (=each of input/output terminals DQ0 to DQ7) that processes data of 8 bits comprising one half of the data of 16 bits is disposed on a part close to the central region of the chip, and the data input/output terminal UDQ (=each of input/output terminals DQ8 to DQ15) that processes data of 8 bits comprising the other half of the 16 bits of data is disposed on a part close to the edge L4 of the chip.

The peripheral circuit region PE11 includes the data buses DB corresponding to the memory banks BANK0 to BANK3 and extending in the Y direction and with other circuit blocks (fuse circuit 40, etc.). Similarly, the peripheral circuit region PE12 includes the data buses DB corresponding to the memory banks BANK4 to BANK7 and extending in the Y direction and with other circuit blocks (fuse circuit 40, etc.).

More specifically, the data buses DB are arranged in the following manner. The data buses DB0L and DB0U assigned to the memory banks BANK0 and BANK1 and the data buses DB1L and DB1U assigned to the memory banks BANK2 and BANK3 are placed in the peripheral circuit region PE11. The data bus DB0L is coupled to the data bus DB1L via the buffer BF1L, and the data bus DB0U is coupled to the data bus DB1U via the buffer BF1U.

Similarly, the data buses DB0L and DB0U assigned to the memory banks BANK6 and BANK7 and the data buses DB1L and DB1U assigned to the memory banks BANK4 and BANK5 are placed in the peripheral circuit region PE12. The data bus DB0L is coupled to the data bus DB1L via the buffer BF1L, and the data bus DB0U is coupled to the data bus DB1U via the buffer BF1U.

The data buses DB1L are coupled to the data bus DB2L via the buffers BF2L. Similarly, the data buses DB1U are coupled to the data bus DB2U via the buffers BF2U. The data bus DB2L has a portion extending in the Y direction to couple together the upper and lower buffers BF2L, and a portion extending in the X direction from a connection point N1 located in the central region of the chip. Similarly, the data bus DB2U has a portion extending in the Y direction to couple together the upper and lower buffers BF2U, and a portion extending in the X direction from a connection point N2 located in the central region of the chip.

The data buses DB2L and DB2U extend from the peripheral circuit region PE10, i.e., central region, to the peripheral circuit region PE14. The data bus DB2U is coupled to the data bus DB3U via a buffer BF3U. The data bus DB2L is coupled to the data input/output terminal LDQ, and the data bus DB3U is coupled to the data input/output terminal UDQ.

In this manner, according to the layout of the first embodiment, no data bus DB needs to be laid in the peripheral circuit region PE13 in which the address control circuit 32, the command decoder 34, etc., are placed. Therefore, the region for forming lines necessary for the operation of the address control circuit 32 and command decoder 34, which region is reduced in the prototype-based layout of FIG. 2, is not reduced in the layout of the first embodiment.

The semiconductor device 10 according to this embodiment is a DRAM that performs 8-bit pre-fetching, and is therefore capable of reading read data of up to 128 bits (=8 bits×16 input/output terminals DQ0 to DQ15) for one access. One half and the other half of the read data of 128 bits read, i.e., one block of data of 64 bits and the other block of data of 64 bits, are transferred to the data input/output terminals LDQ and UDQ, respectively. Each data bus DB, therefore, handles data of 64 bits.

However, as described above referring to FIG. 3, to prevent crosstalk between different lines, both sides of each of 64 data lines comprising each data bus DB must be shielded with respective shielding power lines. Each data bus DB thus needs 129 lines (data lines plus power lines) in total.

The semiconductor device 10 of this embodiment has a first operation mode and a second operation mode.

The first operation mode is a mode in which both data input/output terminals LDQ and UDQ are used. When the first operation mode is selected, data of 16 bits is input/output via the data input/output terminals LDQ and UDQ. In this case, data of 128 bits (=8 bits×16 input/output terminals DQ0 to DQ15) is input/output to/from the memory cell arrays 11 for one access.

The second operation mode is a mode in which the data input/output terminal LDQ is used and the data input/output terminal UDQ is not used. When the second operation mode is selected, the data input/output terminal UDQ is not used and data of 8 bits is input/output via the data input/output terminal LDQ. In this case, data of 64 bits (=8 bits×8 input/output terminals DQ0 to DQ7) is input/output to/from the memory cell arrays 11 for one access.

When the first operation mode is selected, one half of read data from the memory banks BANK0, BANK1, BANK6, and BANK7 is transferred to the data input/output terminal LDQ via the data buses DB0L, DB1L, and DB2L, while the other half of the read data is transferred to the data input/output terminal UDQ via the data buses DB0U, DB1U, DB2U, and DB3U. In this case, one half of the read data is transferred to the data input/output terminal LDQ via two buffers BF1L and BF2L, while the other half of the read data is transferred to the data input/output terminal UDQ via three buffers BF1U to BF3U.

One half of read data from the memory banks BANK2 to BANK5 is transferred to the data input/output terminal LDQ via the data buses DB1L and DB2L, while the other half of the read data is transferred to the data input/output terminal UDQ via the data buses DB1U, DB2U, and DB3U. In this case, one half of the read data is transferred to the data input/output terminal LDQ via one buffer BF2L, while the other half of the read data is transferred to the data input/output terminal UDQ via two buffers BF2U and BF3U.

Figure 6:
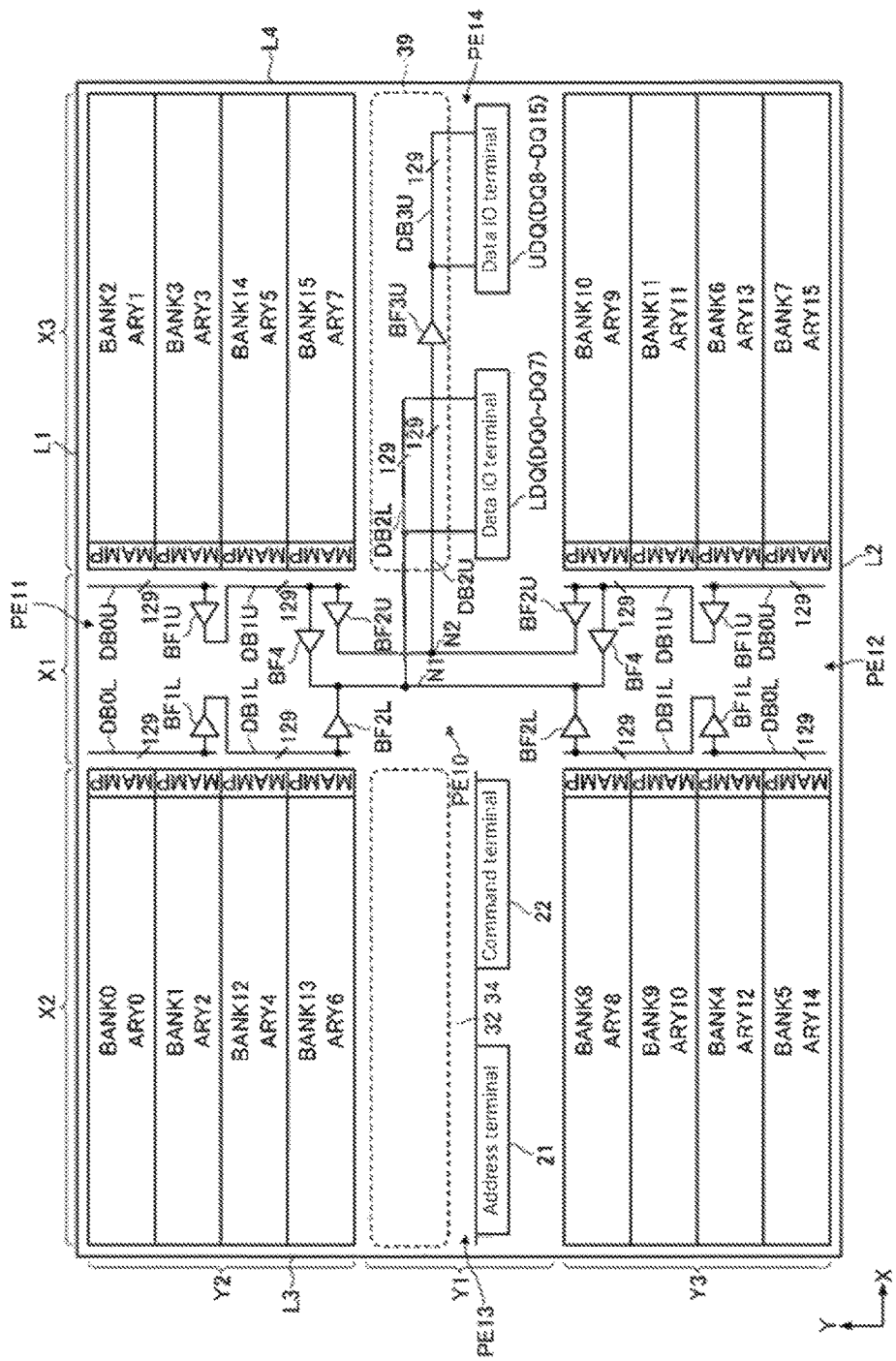
FIG. 6 is a plan view of a layout of the semiconductor device according to the first embodiment, showing a case where a second operation mode is selected.

When the second operation mode is selected, two memory cell array regions comprising each memory bank function as two memory banks different from each other. When the second operation mode is selected, therefore, the semiconductor device 10 of this embodiment is configured to include 16 memory banks BANK0 to BANK15, which are assigned in such a manner as shown in FIG. 6.

When the second operation mode is selected, the data buses DB1U are coupled to the data bus DB2L via buffers BF4. The buffer BF4 is a buffer that is activated when the second operation mode is selected. When the first operation mode is selected, the buffer BF4 is deactivated to a high-impedance-carrying state.

In this configuration, read data from the memory banks BANK0, BANK1, BANK4, and BANK5 is transferred to the data input/output terminal LDQ via the data buses DB0L, DB1L, and DB2L, while read data from the memory banks BANK2, BANK3, BANK6, and BANK7 is transferred to the data input/output terminal LDQ via the data buses DB0U, DB1U, and DB2L.

Read data from the memory banks BANK8, BANK9, BANK12, and BANK13 is transferred to the data input/output terminal LDQ via the data buses DB1L and DB2L, while read data read out of the memory banks BANK 10, BANK 11, BANK14, and BANK15 is transferred to the data input/output terminal LDQ via the data buses DB1U and DB2L.

Figure 7:
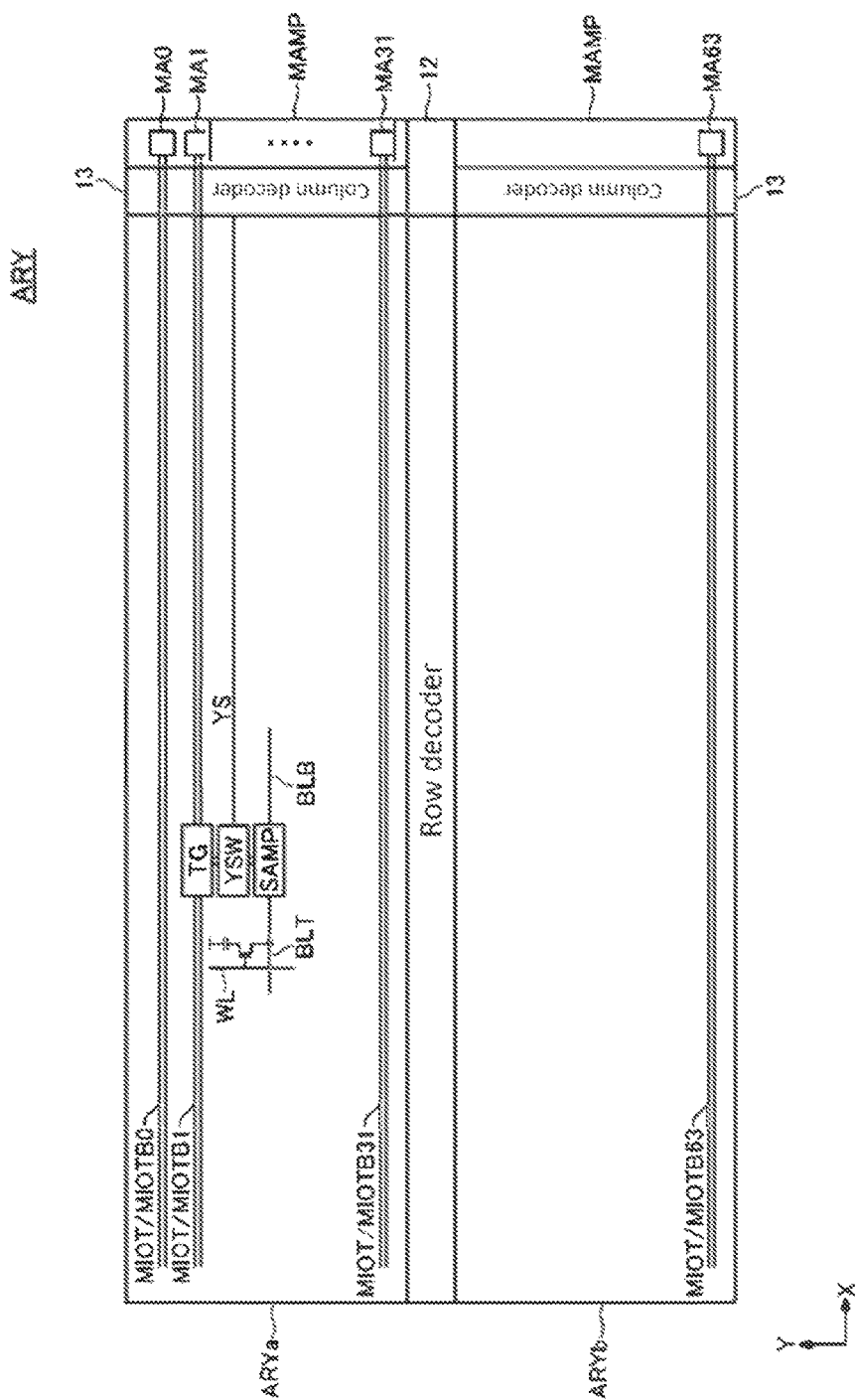
FIG. 7 is a plan view showing a configuration of one memory cell array ARY according to an embodiment of the invention.

FIG. 7 is a plan view for explaining a configuration of one memory cell array ARY.

As shown in FIG. 7, the memory cell array region ARY includes memory cell array subregions ARYa and ARYb divided in the Y direction by the row decoder 12. On one ends in the X direction of the memory cell array subregions ARYa and ARYb, the column decoders 13 and the main amplifiers MAMP are disposed. The main amplifier MAMP assigned to the memory cell array subregion ARYa includes unit amplifiers MA0 to MA31 for processing data of 31 bits, and the main amplifier MAMP assigned to the memory cell array subregion ARYb includes unit amplifiers MA32 to MA63 for processing data of 31 bits.

The unit amplifiers MA0 to MA63 are coupled to main IO lines MIOT/MIOB0 to MIOT/MIOB63 extending in the X direction, respectively. Each main IO line MIOT/MIOB is coupled to each local IO line LIOT/LIOB extending in the Y direction, via a switch circuit TG. The local IO line LIOT/LIOB is coupled to the sense amplifier SAMP via a column switch YSW. The operation of the column switch YSW is controlled by a column selection signal YS supplied from the column decoder 34.

Figure 8:
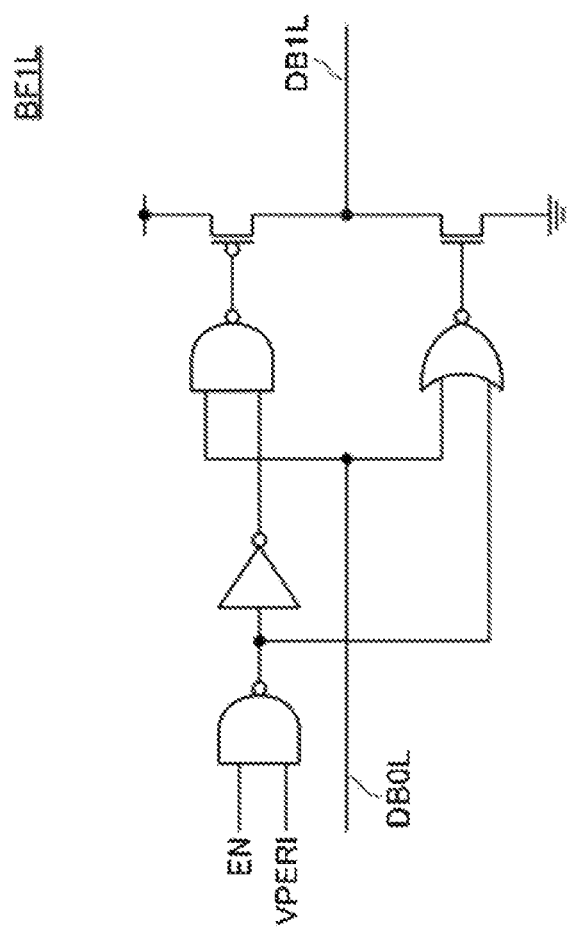
FIG. 8 is a circuit diagram of a buffer BF1L according to an embodiment of the invention.

FIG. 8 is a circuit diagram of the buffer BF1L.

As shown in FIG. 8, the buffer BF1L is a TRI-STATE buffer controlled by an enable signal EN that is activated upon execution of the read operation. When the enable signal EN is activated to a high-voltage level, read data on the data bus DB0L is transferred through the buffer BF1L to the data bus DB1L. When the enable signal EN is deactivated to a low-voltage level, on the other hand, the output node of the buffer BF1L shifts to a high-impedance-carrying state.

FIG. 8 depicts the buffer BF1L used upon execution of the read operation. The circuit configuration of the buffer BF1L used upon execution of the write operation is the same as the circuit configuration of the buffer BF1L of FIG. 8, except that the input and output nodes of the former buffer are reverse in position to the same of the latter buffer. The buffer BF1U also has the same circuit configuration as that of the buffer BF1L of FIG. 8.

Figure 9:
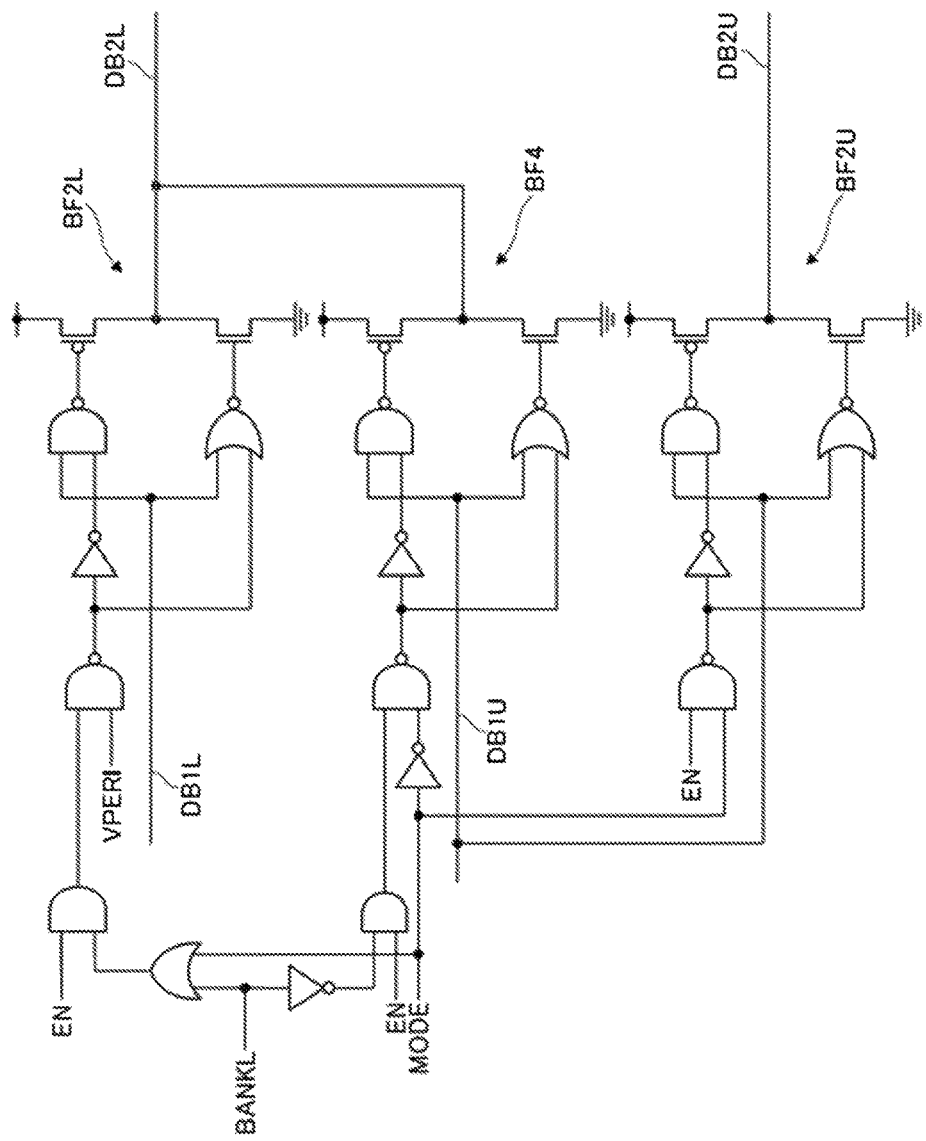
FIG. 9 is a circuit diagram of buffers BF2L, BF2U, and BF4 according to an embodiment of an invention.

FIG. 9 is a circuit diagram of a combination of buffers BF2L, BF2U, and BF4.

As shown in FIG. 9, the buffers BF2L, BF2U, and BF4 are all TRI-STATE buffers. In addition to the enable signal EN, a mode signal MODE and a lower bank signal BANKL are used also to control the buffers BF2L, BF2U, and BF4. The mode signal MODE goes high when the first operation mode (in which both data input/output terminals LDQ and UDQ are used) is selected, and goes low when the second operation mode (in which only the data input/output terminal LDQ, is used) is selected. The lower bank signal BANKL goes high when the banks BANK0, BANK1, BANK4, BANK5, BANK8, BANK9, BANK12, and BANK13 arranged on the left side in the chip are selected in the second operation mode, and goes low when the banks BANK2, BANK3, BANK6, BANK7, BANK10, BANK11, BANK14, and BANK15 arranged on the right side in the chip are selected in the second operation mode.

In the configuration of FIG. 9, when the first operation mode is selected, activating the enable signal EN to a high-voltage level puts both buffers BF2L and BF2U into an activated state. As a result, read data on the data bus DB1L and read data on the DB1U are transferred to the data buses DB2L and DB2U, respectively. In this case, the buffer BF4 is kept in a high-impedance-carrying state, regardless of the enable signal EN being at a high-voltage level or a low-voltage level.

When the second operation mode is selected, activating the enable signal EN to a high-voltage level puts one of the buffers BF2L and BF4 into an activated state, based on the lower bank signal BANKL. As a result, read data on the data bus DB1L or DB1U is transferred to the data bus DB2L. In this case, the buffer BF2U is kept in a high-impedance-carrying state, regardless of the enable signal EN being at a high-voltage level or a low-voltage level.

Figure 10:
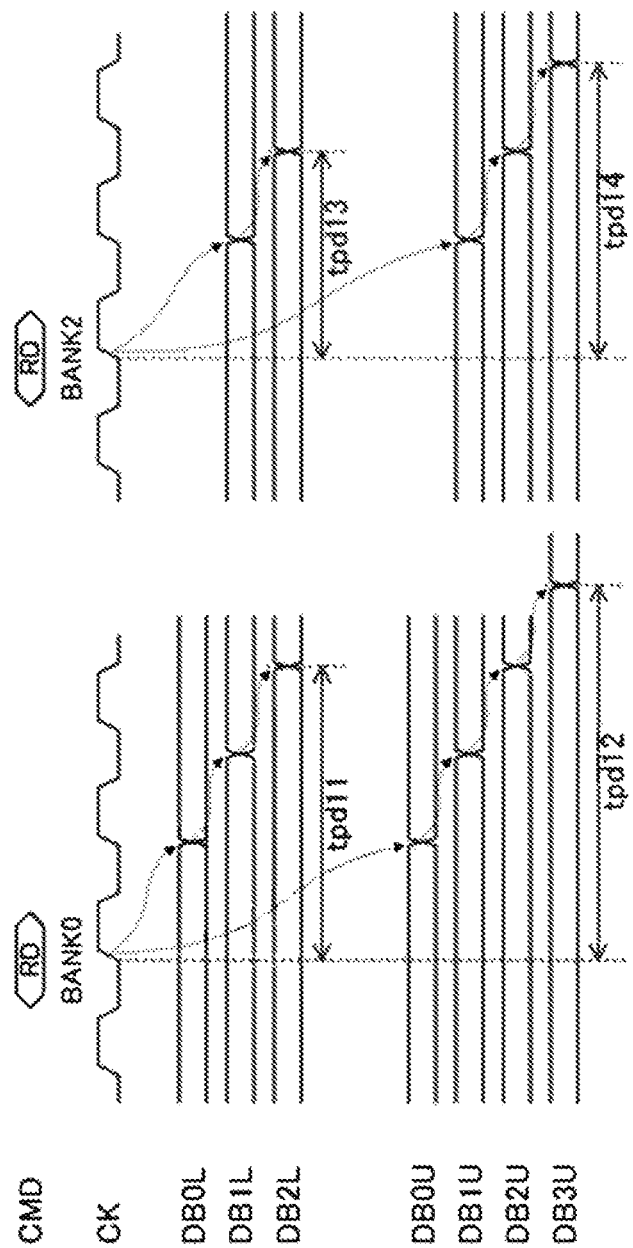
FIG. 10 is a timing chart for explaining operation timing according to the first embodiment, including FIG. 10(A) depicting transfer of read data from the memory bank BANK0 in the first, operation mode and FIG. 10(B) depicting transfer of read data from the memory bank BANK2 in the first operation mode.

FIG. 10 is a timing chart for explaining operation timing according to the first embodiment, including FIG. 10(A) depicting transfer of read data from the memory bank BANK0 in the first operation mode and FIG. 10(B) depicting transfer of read data from the memory bank BANK2 in the first operation mode.

As shown in FIG. 10(A), out of read data from the memory bank BANK0, a block of read data assigned to the data input/output terminal LDQ is transferred via the data buses DB0L, DB1L, and DB2L. In this case, a time that the read data takes from the issue of the read command RD to the read data's arrival at the data input/output terminal LDQ is tpd11. Out of the read data from the memory bank BANK0, a block of read data assigned to the data input/output terminal UDQ is transferred via the data buses DB0U, DB1U, DB2U, and DB3U. In this case, a time that the read data takes from the issue of the read command RD to the read data's arrival at the data input/output terminal UDQ is tpd12 (>tpd11).

As shown in FIG. 10(B), out of read data from the memory bank BANK2, a block of read data assigned to the data input/output terminal LDQ is transferred via the data buses DB1L and DB2L. In this case, a time that the read data takes from the issue of the read command RD to the read data's arrival at the data input/output terminal LDQ is tpd13 (<tpd11). Out of the read data from the memory bank BANK2, a block of read data assigned to the data input/output terminal UDQ is transferred via the data buses DB1U, DB2U, and DB3U. In this case, a time that the read data takes from the issue of the read command RD to the read data's arrival at the data input/output terminal UDQ is tpd14 (approximately equal to tpd11).

Figure 11:
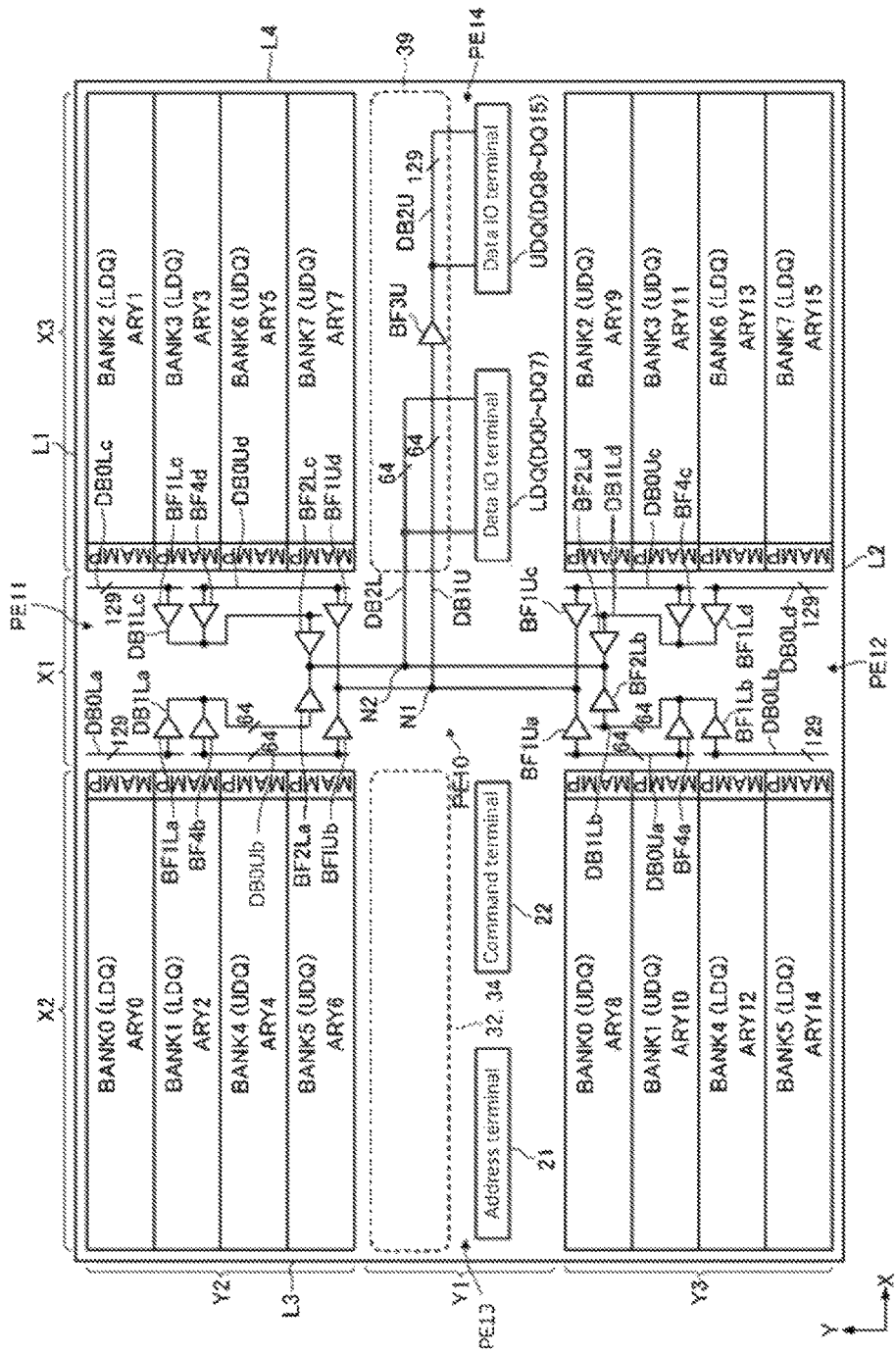
FIG. 11 is a plan view of a layout of the semiconductor device according to a second embodiment, showing a case where the first operation mode is selected.

FIG. 11 is a plan view of a layout of the semiconductor device 10 according to a second embodiment, showing a case where the first operation mode is selected.

As shown in FIG. 11, the layout according to the second embodiment of the present invention and the layout according to the first embodiment of FIG. 5 are the same in the basic positional relationship between the memory cell array regions ARY and the peripheral circuit region PE but are different in the locations of assignment of the memory banks and in the configuration of the data buses DB.

Assignment of the memory banks will first be described. When the locations of the memory cell array regions ARY0 to ARY15 are the same as the locations of the memory cell array regions ARY0 to ARY15 shown in FIG. 5, each memory bank BANKi (i=0 to 7) in FIG. 11 comprises a memory cell array region ARYi and a memory cell array region ARYi+8. For example, the memory bank BANK0 comprises the memory cell array region ARY0 and the memory cell array region ARY8.

As a result, two memory cell array regions comprising the same memory bank are always different in their coordinates in the Y direction and in their distances in the Y direction to the peripheral circuit region PE13 or PE14. For example, for the case of the memory cell array regions ARY0 and ARY8 comprising the memory bank BANK0, the distance from the memory cell array region ARY0 to the peripheral circuit region PE13 is greater than the distance from the memory cell array region ARY8 to the peripheral circuit region PE13.

The details of the arrangement of the data buses DB are as follows. In the peripheral circuit region PE11, data buses DB0La, DB0Ub, and DB1La are placed such that the data bus DB0La is assigned to the memory cell array regions ARY0 and ARY2, the data bus DB0Ub is assigned to the memory cell array regions ARY4 and ARY6, and the data bus DB1La is coupled to the data bus DB0La via a buffer BF1La. Data buses DB0Lc, DB0Ud, and DB1Lc and a buffer BF1Lc identical in configuration with the data buses DB0La, DB0Ub, and DB1La and the Buffer BF1La are also provided for the memory cell array regions ARY1, ARY3, ARY5, and ARY7.

Likewise, in the peripheral circuit region PE12, data buses DB0Lb, DB0Ua, and DB1Lb are placed such that the data bus DB0Lb is assigned to the memory cell array regions ARY12 and ARY14, the data bus DB0Ua is assigned to the memory cell array regions ARY8 and ARY10, and the data bus DB1Lb is coupled to the data bus DB0Lb via a buffer BF1Lb. Data buses DB0Ld, DB0Uc, and DB1Ld and a buffer BF1Ld identical in configuration with the data buses DB0Lb, DB0Ua, and DB1Lb and the Buffer BF1Lb are also provided for the memory cell array regions ARY9, ARY11, ARY13, and ARY15.

The data buses DB1La to DB1Ld are coupled to the data bus DB2L via buffers BF2La to BF2Ld, respectively. The data buses DB1Ua to DB1Ud are coupled to the data bus DB1U via buffers BF1Ua to BF1Ud, respectively. The data bus DB2L has a portion extending in the Y direction to couple together the buffers BF2La to BF2Ld, and a portion extending in the X direction from the connection point N2 located in the central region of the chip. Similarly, the data bus DB1U has a portion extending in the Y direction to couple together the buffers BF1Ua to BF1Ud, and a portion extending in the X direction from the connection point N1 located in the central region of the chip.

The data buses DB2L and DB1U extend from the peripheral circuit region PE10, i.e., central region, to the peripheral circuit region PE14. The data bus DB1U is coupled to the data bus DB2U via the buffer BF3U. The data bus DB2L is coupled to the data input/output terminal LDQ, and the data bus DB2U is coupled to the data input/output terminal UDQ.

When the first operation mode is selected in the layout of this embodiment, transmission paths for read data read out of the memory banks are taken as follows.

One half of read data from the memory banks BANK0 and BANK1 is transferred to the data input/output terminal LDQ via the data buses DB0La, DB1La, and DB2L, while the other half of the read data is transferred to the data input/output terminal UDQ via the data buses DB0Ua, DB1U, and DB2U. In this case, one half of the read data is transferred to the data input/output terminal LDQ via two buffers BF1La and BF2La, while the other half of the read data is transferred to the data input/output terminal UDQ via two buffers BF1Ua and BF3U.

The transmission path comprises the data buses DB0La, DB1La, and DB2L can be divided into a section extending from the memory cell array regions ARY0 and ARY2 to the connection point N2 and a section extending from the connection point N2 to the data input/output terminal LDQ. The former section can be further divided into a subsection extending from the memory cell array regions ARY0 and ARY2 to the buffer BF1La and a subsection extending from the buffer BF1La to the connection point N2. The transmission path comprising the data buses DB0Ua, DB1U, and DB2U can be divided into a section extending from the memory cell array regions ARY8 and ARY10 to the connection point N1 and a section extending from the connection point N1 to the data input/output terminal UDQ.

One half of read data from the memory banks BANK2 and BANK3 is transferred to the data input/output terminal LDQ via the data buses DB0Lc, DB1Lc, and DB2L, while the other half of the read data is transferred to the data input/output terminal UDQ via the data buses DB0Uc, DB1U, and DB2U. In this case, one half of the read data is transferred to the data input/output terminal LDQ via two buffers BF1Lc and BF2Lc, while the other half of the read data is transferred to the data input/output terminal UDQ via two buffers BF1Uc and BF3U.

The transmission path comprising the data buses DB0Lc, DB1Lc, and DB2L can be divided into a section extending from the memory cell array regions ARY1 and ARY3 to the connection point N2 and a section extending from the connection point N2 to the data input/output terminal LDQ. The former section can be further divided into a subsection extending from the memory cell array regions ARY1 and ARY3 to the buffer BF1Lc and a subsection extending from the buffer BF1Lc to the connection point N2. The transmission path comprising the data buses DB0Uc, DB1U, and DB2U can be divided into a section extending from the memory cell array regions ARY9 and ARY11 to the connection point N1 and a section extending from the connection point N1 to the data input/output terminal UDQ.

One half of read data from the memory banks BANK4 and BANK5 is transferred to the data input/output terminal LDQ via the data buses DB0Lb, DB1Lb, and DB2L, while the other half of the read data is transferred to the data input/output terminal UDQ via the data buses DB0Ub, DB1U, and DB2U. In this case, one half of the read data is transferred to the data input/output terminal LDQ via two buffers BF1Lb and BF2Lb, while the other half of the read data is transferred to the data input/output terminal UDQ via two buffers BF1Ub and BF3U.

The transmission path comprising the data buses DB0Lb, DB1Lb, and DB2L can be divided into a section extending from the memory cell array regions ARY12 and ARY14 to the connection point N2 and a section extending from the connection point N2 to the data input/output terminal LDQ. The former section can be further divided into a subsection extending from the memory cell array regions ARY12 and ARY14 to the buffer BF1Lb and a subsection extending from the buffer BF1Lb to the connection point N2. The transmission path comprising the data buses DB0Ub, DB1U, and DB2U can be divided into a section extending from the memory cell array regions ARY4 and ARY6 to the connection point N1 and a section extending from the connection point N1 to the data input/output terminal UDQ.

One half of read data from the memory banks BANK6 and BANK7 is transferred to the data input/output terminal LDQ via the data buses DB0Ld, DB1Ld, and DB2L, while the other half of the read data is transferred to the data input/output terminal UDQ via the data buses DB0Ud, DB1U, and DB2U. In this case, one half of the read data is transferred to the data input/output terminal LDQ via two buffers BF1Ld and BF2Ld, while the other half of the read data is transferred to the data input/output terminal UDQ via two buffers BF1Ud and BF3U.

The transmission path comprising the data buses DB0Ld, DB1Ld, and DB2L can be divided into a section extending from the memory cell array regions ARY13 and ARY15 to the connection point N2 and a section extending from the connection point N2 to the data input/output terminal LDQ. The former section can be further divided into a subsection extending from the memory cell array regions ARY13 and ARY15 to the buffer BF1Ld and a subsection extending from the buffer BF1Ld to the connection point N2. The transmission path comprising the data buses DB0Ud, DB1U, and DB2U can be divided into a section extending from the memory cell array regions ARY5 and ARY7 to the connection point N1 and a section extending from the connection point N1 to the data input/output terminal UDQ.

Figure 12:
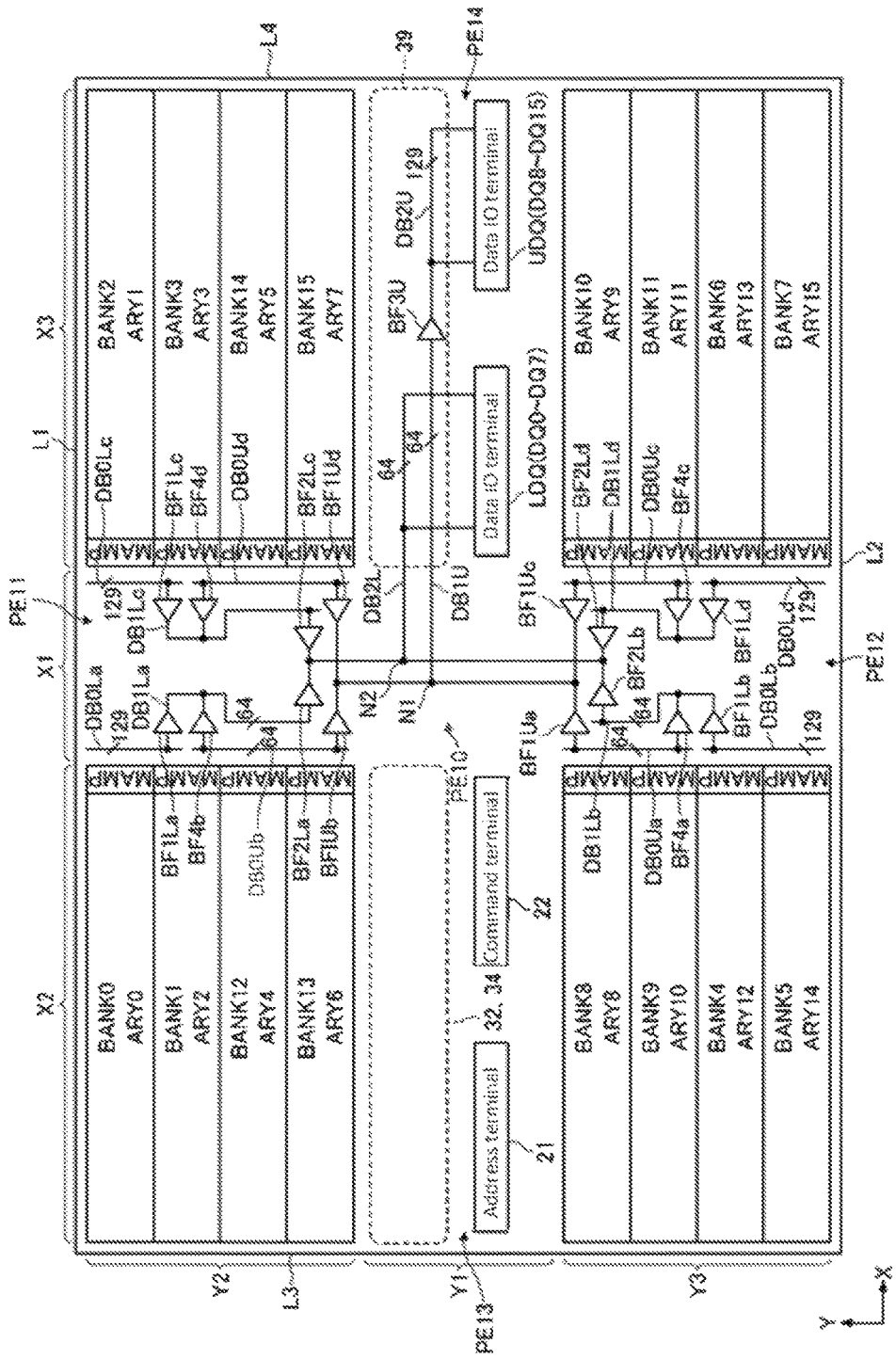
FIG. 12 is a plan view of a layout of the semiconductor device according to the second embodiment, showing a case where the second operation mode is selected.

When the second operation mode is selected, the memory banks BANK0 to BANK15 are assigned according to this embodiment in such a manner as shown in FIG. 12.

When the second operation mode is selected, the data buses DB0Ua to DB0Ud are coupled to the data buses DB1La to DB1Ld via buffers BF4a to BF4d, respectively. The buffers BF4a to BF4d are buffers that are activated when the second operation mode is selected. When the first operation mode is selected, therefore, the buffers BF4a to BF4d shifts to a high-impedance-carrying state.

In this configuration, read data from the memory banks BANK0 to BANK7 is transferred to the data input/output terminal LDQ via the data buses DB0La to DB0Ld, DB1La to DB1Ld, and DB2L, while read data read out of the memory banks BANK8 to BANK15 is transferred to the data input/output terminal LDQ via the data buses DB0Ua to DB0Ud, DB1La to DB1Ld, and DB2L.

Figure 13:
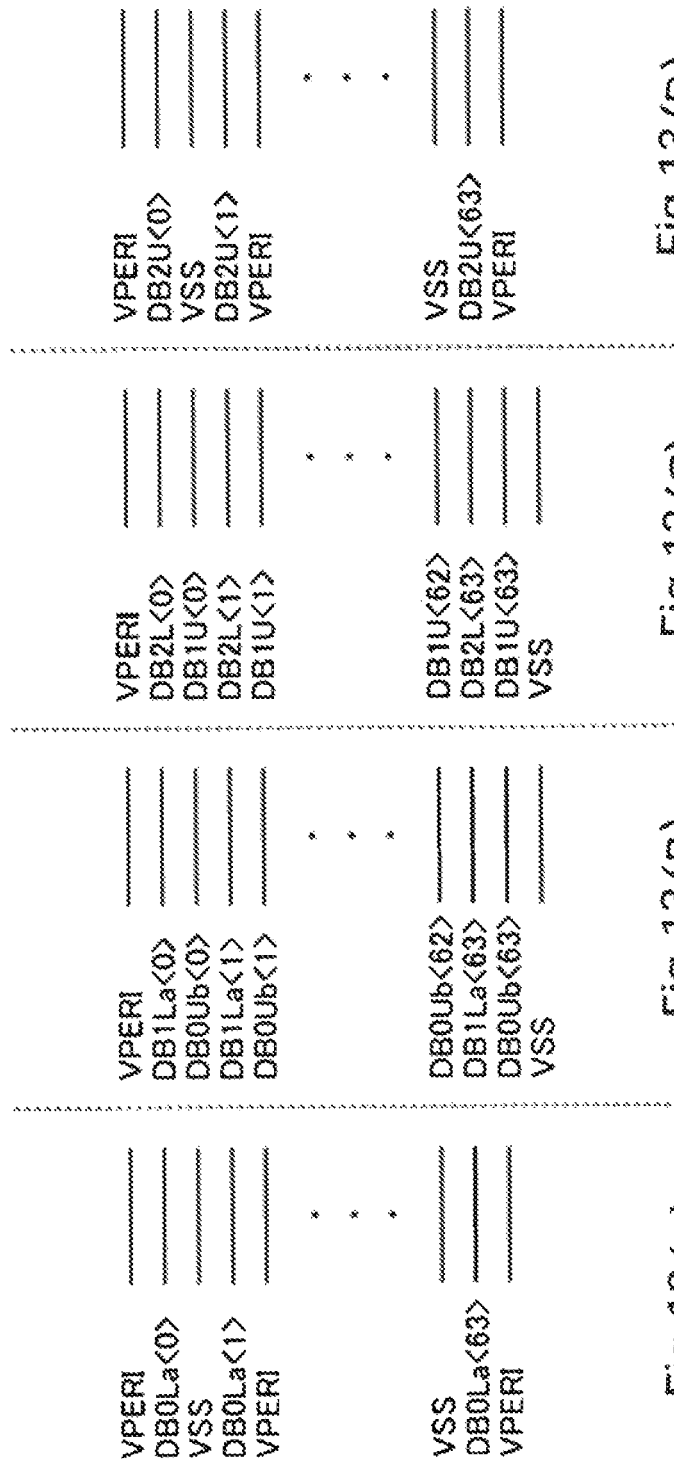
FIG. 13 is a diagram for explaining the structure or the data bus DB, including FIG. 13(A) depicting the structure of a data bus DB0La, FIG. 13(B) depicting the structures of data buses DB0Ub and DB1La, FIG. 13(C) depicting the structures of data buses DB1U and DB2L, and FIG. 13(D) depicting the structure of a data bus DB2U.

FIG. 13 is a diagram for explaining the structure of the data bus DB, including FIG. 13(A) depicting the structure of the data bus DB0La, FIG. 13(B) depicting the structures of the data buses DB0Ub and DB1La, FIG. 13(C) depicting the structures of the data buses DB1U and DB2L, and FIG. 13(D) depicting the structure of the data bus DB2U.

As shown in FIG. 13(A), both sides of each of 64 data lines comprising the data bus DB0La is shielded with respective shielding power lines VSS and VPERI. Hence a region for thrilling the data bus DB0La needs to include 129 lines in total. This fact applies also to other data buses DB0Lb to DB0Ld.

As shown in FIG. 13(B), 64 data lines comprising the data bus DB0Ub and 64 data lines comprising the data bus DB1La are arranged alternately, and the shielding power lines VSS and VPERI are disposed respectively on both sides of a group of 128 data lines comprising the data buses DB0Ub and DB1La. Hence a region for forming the data buses DB0Ub and DB1La needs to include 130 lines in total. In this configuration, the data buses DB0Ub and DB1La function as shields to give protection each other. This fact applies also to other combinations of data buses, that is, combinations of the data buses DB0Ua and DB1Lb, DB0Ud and DB1Lc, and DB0Uc and DB1Ld.

As shown in FIG. 13(C), 64 data lines comprising the data bus DB1U and 64 data lines comprising the data bus DB2L are arranged alternately, and the shielding power lines VSS and VPERI are disposed respectively on both sides of a group of 128 data lines making up the data buses DB1U and DB2L. Hence a region for forming the data buses DB1U and DB2L needs to include 130 lines, in total. In this manner, the data buses DB1U and DB2L also function as shields to give protection each other.

As shown in FIG. 13(D), both sides of each of 64 data lines comprising the data bus DB2U is shielded with respective shielding power lines VSS and VPERI. Hence a region for forming the data bus DB2U needs to include 129 lines in total.

In this manner, according to the layout of this embodiment, one part and the other part of the data bus DB function as shields to give protection each other. As a result, the number of power lines needed as shields can be reduced.

Figure 14:
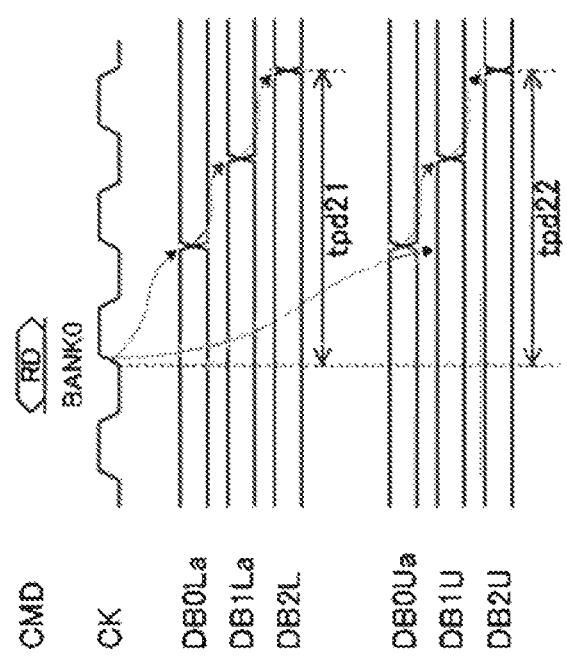
FIG. 14 is a first timing chart for explaining a read operation timing according to the second embodiment.

FIG. 14 is a first timing chart for explaining operation timing according to the second embodiment. FIG. 14 depicts transfer of read data from the memory bank BANK0 in the first operation mode. Operation timing in cases of transferring read data from the memory banks BANK1 to BANK7 is basically the same as the operation timing depicted in the first timing chart of FIG. 14.

As shown in FIG. 14, out of read data from the memory bank BANK0 responsive to the read command RD, a block of read data assigned to the data input/output terminal LDQ (a block of read data stored in the memory cell array region ARY0) is transferred via the data buses DB0La, DB1La, and DB2L. In this case, the read data passes through two buffers and a time that the read data takes from the issue of the read command RD to the read data's arrival at the data input/output terminal LDQ is tpd21.

Out of the read data from the memory bank BANK0, a block of read data assigned to the data input/output terminal UDQ (a block of read data stored in the memory cell array region ARY8) is transferred via the data buses DB0Ua, DB1U, and DB2U. In this case, the read data passes through two buffers and a time that the read data takes from the issue of the read command RD to the read data's arrival at the data input/output terminal UDQ is tpd22.

The data bus DB assigned to the data input/output terminal LDQ and the data bus DB assigned to the data input/output terminal UDQ are almost equal in total line length with each other and carry buffers equal in number with each other. Specifically, the data bus DB assigned to the data input/output terminal LDQ has a section 1 extending from the memory cell array region ARY0 to the connection point N2 and a section 2 extending from the connection point N2 to the data input/output terminal LDQ, while the data bus DB assigned to the data input/output terminal UDQ has a section 3 extending from the memory cell array region ARY8 to the connection point N1 and a section 4 extending from the connection point N1 to the data input/output terminal UDQ. When the lengths of the sections 1 to 4 are denoted as S1 to S4, respectively, the following relations are satisfied.

S1>S3

S2<S4

S1+S2 is approximate equal to S3+S4

Since both of the data assigned to the data input/output terminal LDQ and the data assigned to the data input/output terminal UDQ pass through two buffers, respectively, the arrival time tpd21 roughly matches the arrival time tpd22. This allows faster data transfer.

When read data is transferred via the data bus DB1La, the data bus DB0Ub, i.e., the data lines comprising the data bus DB0Ub that are arranged alternately with the data lines comprising the data bus DB1La, functions as a shield. In the same manner, when read data is transferred via the data bus DB0Ua, the data bus DB1Lb, i.e., the data lines comprising the data bus DB1Lb that are arranged alternately with the data lines comprising the data bus DB0Ua, function as a shield.

Obviously, data is also transferred via the data buses DB0Ub and DB1Lb functioning as shields. However, these data buses DB0Ub and DB1Lb are assigned to the memory banks BANK4 and BANK5 different from the memory bank BANK0. Therefore, simultaneous data transfer through both data buses functioning as shields to each other does not happen. This means that when data is transferred via one data bus DB, the voltage level of the other data bus DB is always fixed. This allows both data buses DB to exert their shield effects for mutual protection.

Figure 15:
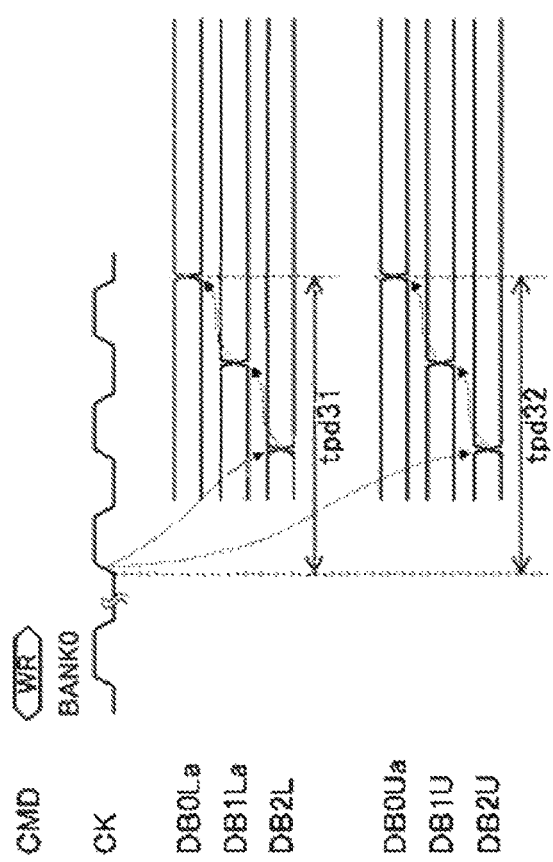
FIG. 15 is a second timing chart for explaining a write operation timing according to the second embodiment.

FIG. 15 is a second timing chart for explaining the operation timing according to the second embodiment. FIG. 1 depicts transfer of write data to be written to the memory bank BANK0 in the first operation mode. Operation timing in cases of writing write data to the memory banks BANK1 to BANK7 is basically the same as the operation timing depicted in the second timing chart of FIG. 15.

As shown in FIG. 15, out of write data input to the data input/output terminals LDQ and UDQ responsive to a write command WR, a block of write data input to the data input/output terminal LDQ is transferred to the memory cell array region ARY0 via the data buses DB2L, DB1La, and DB0La, and a block of write data input to the data input/output terminal UDQ is transferred to the memory cell array region ARY8 via the data buses DB2U, DB1U, and DB0Ua.

In this case, a time that the write data takes from its being input to the data input/output terminal LDQ to its arrival at the memory cell array region ARY0 is tpd31. A time that the write data takes from its being input to the data input/output terminal UDQ to its arrival at the memory cell array region ARY8 is tpd32 (approximately equal to tpd31).

In this manner, according to this embodiment, a time at which the write data assigned to the data input/output terminal LDQ arrives at the memory cell array ARY0 roughly matches a time at which the write data assigned to the data input/output terminal UDQ arrives at the memory cell array ARY8. In addition, in the same manner as in the case of the read operation, the data bus DB0Ub functions as a shield when the write data is transferred via the data bus DB1La, and the data bus DB1Lb functions as a shield when the write data is transferred via the data bus DB0Ua.

Figure 16:
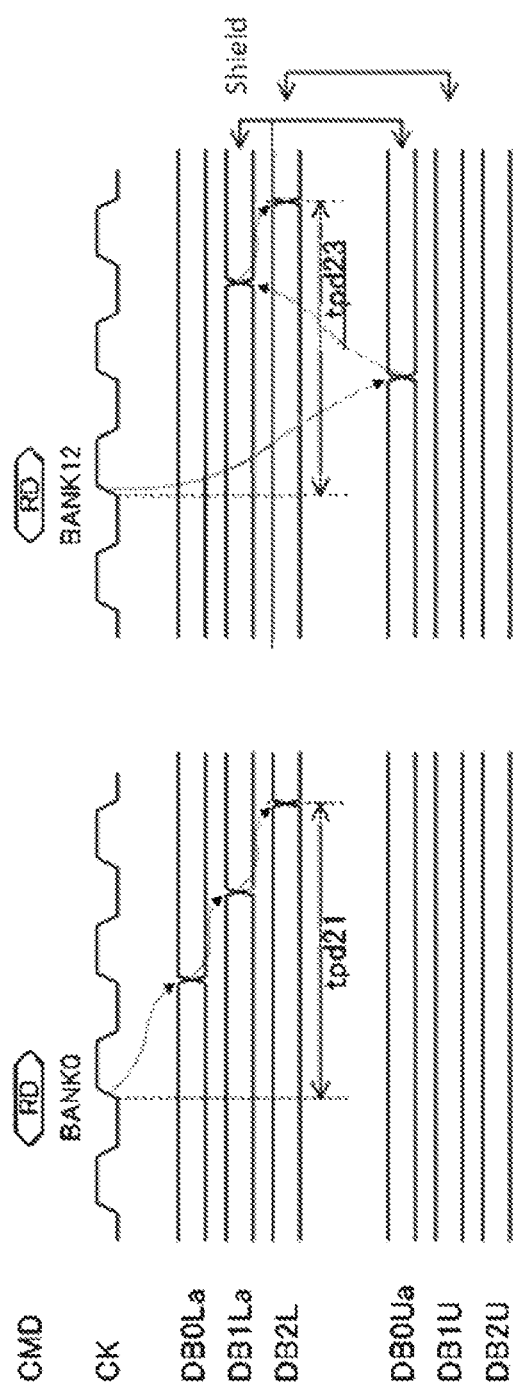
FIG. 16 is a third timing chart for explaining a shield structure in the read operation according to the second embodiment.

FIG. 16 is a third timing chart for explaining the operation timing according to the second embodiment. FIG. 16 depicts transfer of read data read out of the memory banks BANK0 and BANK12 in the second operation mode. Operation timing in cases of reading read data from other memory banks is basically the same as the operation timing depicted in the third timing chart of FIG. 16.

As shown in FIG. 16, read data from the memory bank BANK0 responsive to the read command RD is transferred to the data input/output terminal LDQ via the data buses DB0La, DB1La, and DB2L. In this case, a time that the read data takes from the issue of the read command RD to the read data's arrival at the data input/output terminal LDQ is tpd21.

Read data from the memory bank BANK12 responsive to another read command RD is transferred to the data input/output terminal LDQ via the data buses DB0Ub, DB1La, and DB2U. In this case, a time that the read data takes from the issue of the read command RD to the read data's arrival at the data input/output terminal LDQ is tpd23.

The data bus DB assigned to the memory bank BANK0 and the data bus DB assigned to the memory bank BANK12 are almost equal in total line length with each other and carry buffers equal in number with each other. As a result, the arrival time tpd21 roughly matches the arrival time tpd23.

In this manner, in the second operation mode, each access time required for accessing each memory bank is almost the same. This holds true for the case of the write operation as well as for the case of the read operation. Because access to a certain memory bank and access to another memory bank do not occur simultaneously but always occur at different points in time across a given time interval, one of two data buses DB that shield each other is always given a fixed potential.

In the example of FIG. 16, when the read data from the memory bank BANK0 is transferred via the data bus DB1La, data transfer from the memory bank BANK12 via the data bus DB0Ub is not carried out yet. As a result, a proper shield effect can be achieved. When the read data from the memory bank BANK12 is transferred via the data bus DB0Ub, on the other hand, data transfer from the memory bank BANK0 via the data bus DB1La is already finished. A proper shield effect, therefore, can also be achieved in this case.

When the read data from the memory bank BANK12 is transferred via the data bus DB1La, data transfer from the memory bank BANK12 via the data bus DB0Ub is already finished. A proper shield effect, therefore, can also be achieved in this case.

In this manner, according to the second embodiment of the present invention, a shift in data input/output timing between memory banks or between memory cell array regions does not arise, regardless of which operation mode is selected. Hence high-speed accessing can be realized. In addition, two data buses DB that transfer data in different timing are combined such that data lines comprising one data bus and data lines comprising the other data bus are arranged alternately to offer a shield effect. This allows a reduction in the number of power-line-utilized shields.

According to the second embodiment a method of assigning memory banks when the first operation mode is selected is not limited to the method of assignment shown in FIG. 11. A method of assignment shown in FIG. 17 or 18 may also be used.

Figure 17:
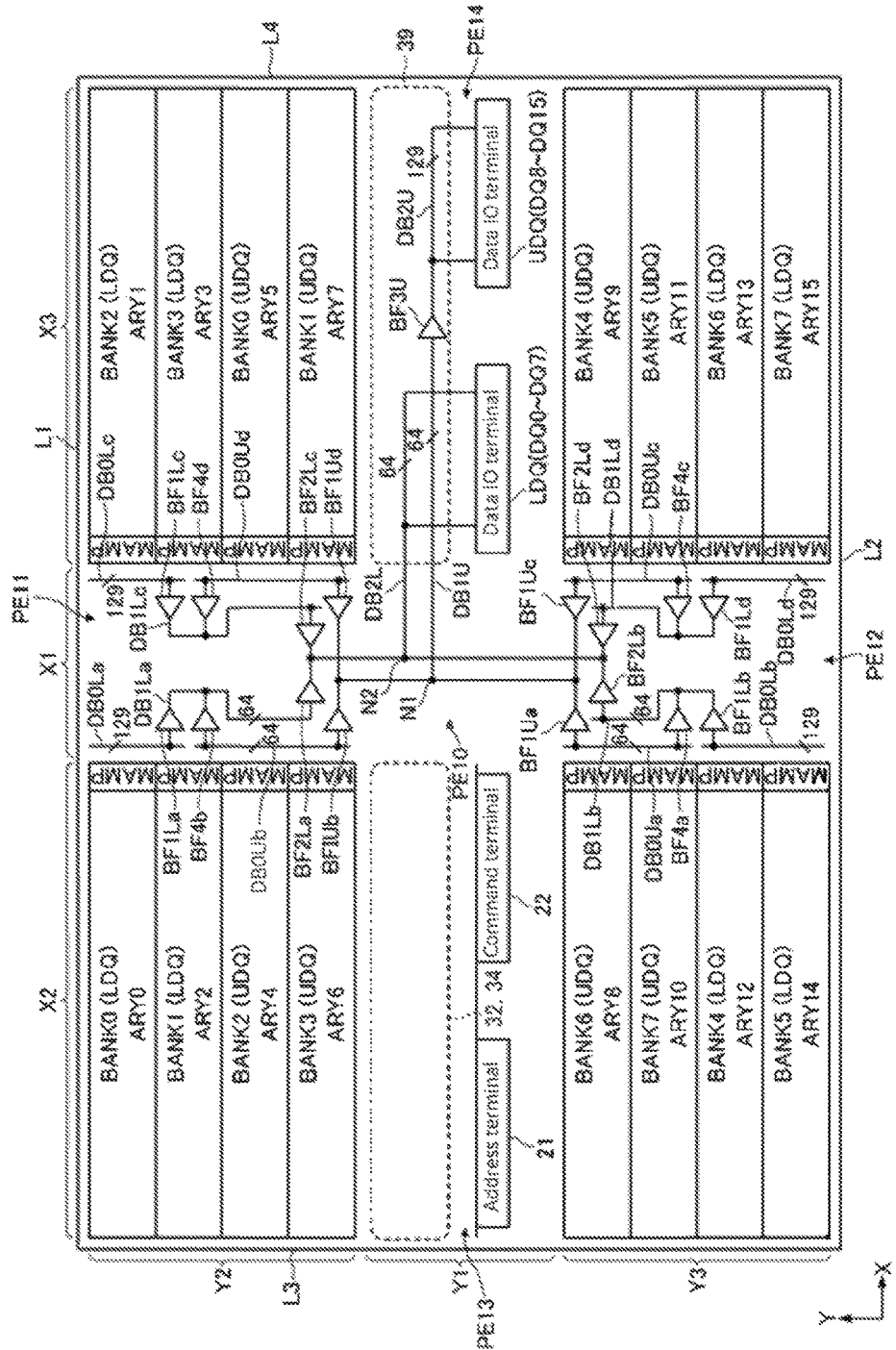
FIG. 17 is a plan view of a first modification of the layout of the semiconductor device according to the second embodiment, showing a case where the first operation mode is selected.
Figure 18:
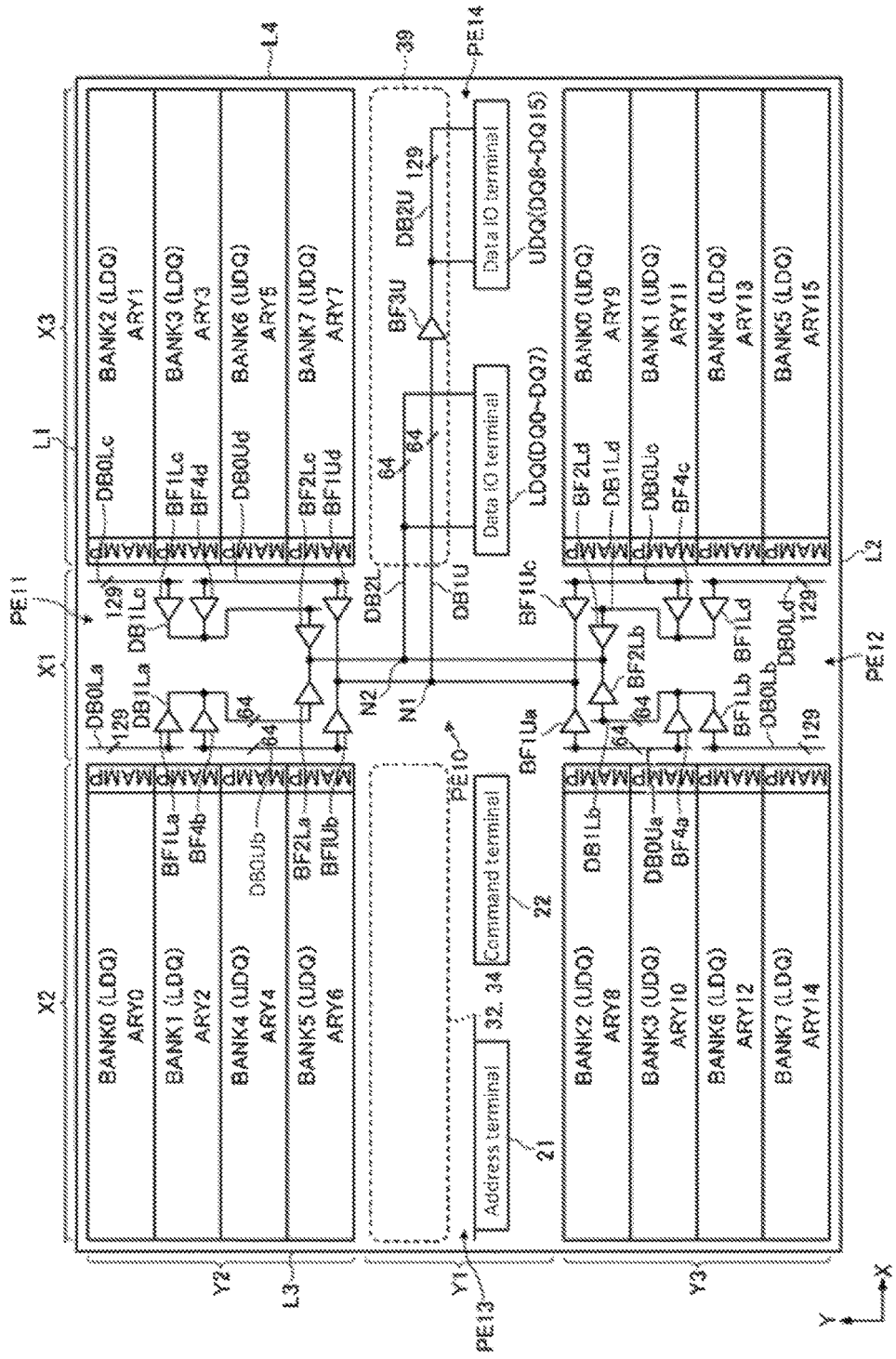
FIG. 18 is a plan view of a second modification of the layout of the semiconductor device according to the second embodiment, showing a case where the first operation mode is selected.

According to the method of assignment shown in FIG. 17, for example, two memory cell array regions ARY comprising the memory bank BANK0 in the first operation mode are located in a region where the coordinates X2 and coordinates Y2 intersect and a region where the coordinates X3 and coordinates Y2 intersect, respectively. According to the method of assignment shown in FIG. 18, for example, two memory cell array regions ARY comprising the memory bank BANK0 in the first operation mode are located in the region where the coordinates X2 and coordinates Y2 intersect and a region where the coordinates X3 and coordinates Y3 intersect, respectively. These methods of assignment achieve the same effect as the effect achieved in the second embodiment.

The preferred embodiments of the present invention have been described above. The present invention is not limited to the above embodiments but may be modified into various forms of applications on the condition that the modification does not deviate from the substance of the invention. It is obvious that modified forms of applications are also included in the scope of the invention.

For example, the above embodiments relate to cases where the present invention is applied to DRAM. A device to which the invention is applied, however, is not limited to DRAM. For another example, SRAM (Static Random Access Memory), Flash memory, ReRAM (Resistive Random Access Memory) and MRAM (Magneto resistive Random Access Memory) etc. are also applicable to this invention as the device.

What is claimed is:

1. An apparatus comprising:
a first memory bank;
a second memory bank, the second memory bank and the first memory bank being arranged in line a first direction;
a plurality of first data lines coupled to transfer a plurality of first data read from the first memory bank, the plurality of first data lines extending in the first direction; and
a plurality of second data lines coupled to transfer a plurality of second data read from the second memory bank, the plurality of second data lines extending in the first direction and extending, at least in part, in parallel to the plurality of first data lines;
wherein the plurality of first data lines do not transfer any data read from the second memory bank.

2. The apparatus of claim 1, wherein each of the plurality of second data lines comprises a first portion extending directly adjacent to a corresponding one of the plurality of first data lines.

3. The apparatus of claim 2, wherein each of the plurality of second data lines comprises a second portion extending directly adjacent to a corresponding one of voltage lines.

4. The apparatus of claim 3, further comprising a plurality of first buffer circuits each coupled between the first and second portions of a corresponding one of the plurality of second data lines.

5. The apparatus of claim 4, further comprising a plurality of second buffer circuits and a plurality of third buffer circuits;
wherein the first portion of each of the plurality of second data lines is coupled to a corresponding one of the plurality of second buffer circuits; and
wherein each of the plurality of first data lines is coupled to a corresponding one of the plurality of third buffer circuits.

6. The apparatus of claim 1, further comprising:
a first main amplifier circuit configured to drive the plurality of first data lines based on the plurality of first data; and a second main amplifier circuit configured to drive the plurality of second data lines based on the plurality of second data.

7. The apparatus of claim 6, wherein the first main amplifier circuit and the first memory bank are arranged in line in a second direction crossing the first direction and the second main amplifier circuit and the second memory bank are arranged in line in the second direction.

8. The apparatus of claim 1, further comprising:
a third memory bank, the third memory bank and the first memory bank being arranged in line in a second direction crossing the first direction;
a fourth memory bank, the fourth memory bank and the second memory bank being arranged in line in the second direction;
a plurality of third data lines coupled to transfer a plurality of third data read from the third memory bank, the plurality of third data lines extending in the first direction; and
a plurality of fourth data lines coupled to transfer a plurality of fourth data read from the fourth memory bank, the plurality of fourth data lines extending in the first direction and extending, at least in part, in parallel to the plurality of third data lines;
wherein the plurality of third data lines do not transfer any data read from the fourth memory bank.

9. The apparatus of claim 8, wherein each of the plurality of fourth data lines comprises a third portion extending directly adjacent to a corresponding one of the plurality of third data lines.

10. The apparatus of claim 9, wherein each of the plurality of fourth data lines comprises a fourth portion extending directly adjacent to a corresponding other one of the plurality of fourth data lines.

11. The apparatus of claim 10, further comprising a plurality of fourth buffer circuits each coupled between the third and fourth portions of a corresponding one of the plurality of fourth data lines.

12. The apparatus of claim 11, further comprising a plurality of fifth buffer circuits and a plurality of sixth buffer circuits;
wherein the third portion of each of the plurality of fourth data lines is coupled to a corresponding one of the plurality of fifth buffer circuits; and
wherein each of the plurality of third data lines is coupled to a corresponding one of the plurality of sixth buffer circuits.

13. An apparatus comprising:
a first memory bank;
a second memory bank arranged directly adjacent to the first memory bank;
a plurality of first data lines coupled to transfer a plurality of first data read from the first memory bank; and
a plurality of second data lines coupled to transfer a plurality of second data read from the second memory bank, the plurality of second data lines extending, at least in part, in parallel to the plurality of first data lines;
wherein the plurality of first data lines do not transfer any data read from the second memory bank.

14. The apparatus of claim 13, wherein each of the plurality of second data lines comprises a first portion extending directly adjacent to a corresponding one of the plurality of first data lines.

15. The apparatus of claim 14, wherein each of the plurality of second data lines comprises a second portion extending directly adjacent to a corresponding one of voltage lines.

16. The apparatus of claim 15, further comprising a plurality of first buffer circuits each coupled between the first and second portions of a corresponding one of the plurality of second data lines.

17. The apparatus of claim 16, further comprising a plurality of second buffer circuits and a plurality of third buffer circuits;
- wherein the first portion of each of the plurality of second data lines is coupled to a corresponding one of the plurality of second buffer circuits; and
- wherein each of the plurality of first data lines is coupled to a corresponding one of the plurality of third buffer circuits.

18. The apparatus of claim 13, further comprising:
- a first main amplifier circuit configured to drive the plurality of first data lines based on a plurality of first data stored in the first memory bank; and
- a second main amplifier circuit configured to drive the plurality of second data lines based on a plurality of second data stored in the second memory bank.

* * * * *